(12) United States Patent
Sasaki

(10) Patent No.: US 8,461,658 B2
(45) Date of Patent: Jun. 11, 2013

(54) SPIN TRANSPORT DEVICE

(75) Inventor: Tomoyuki Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/351,632

(22) Filed: Jan. 17, 2012

(65) Prior Publication Data
US 2012/0181643 A1 Jul. 19, 2012

(30) Foreign Application Priority Data

Jan. 19, 2011 (JP) ................................. 2011-009234

(51) Int. Cl.
*H01L 29/82* (2006.01)

(52) U.S. Cl.
USPC .......................................... 257/421; 257/295

(58) Field of Classification Search
USPC .................. 257/421, 295, 422, 423, 424, 425
See application file for complete search history.

(56) References Cited

U.S. PATENT DOCUMENTS

| | | | |
|---|---|---|---|
| 5,640,343 A * | 6/1997 | Gallagher et al. | ............ 365/171 |
| 5,998,842 A | 12/1999 | Sano | |
| 6,218,703 B1 | 4/2001 | Sano | |
| 6,479,848 B2 * | 11/2002 | Park et al. | ..................... 257/295 |
| 7,545,013 B2 | 6/2009 | Sugahara et al. | |
| 7,848,136 B2 * | 12/2010 | Aikawa et al. | ................ 365/158 |

FOREIGN PATENT DOCUMENTS

| JP | A-09-97906 | 4/1997 |
|---|---|---|
| JP | A-2002-246487 | 8/2002 |
| JP | B2-3818276 | 9/2006 |
| JP | 4143644 | 9/2008 |

OTHER PUBLICATIONS

Jedema, F.J. et al., "Electrical detection of spin precession in a metallic mesoscopic spin Valve," *Nature*, vol. 416, pp. 713-716, 2002.

* cited by examiner

*Primary Examiner* — Julio J Maldonado
*Assistant Examiner* — Robert Bachner
(74) *Attorney, Agent, or Firm* — Oliff & Berridge, PLC

(57) ABSTRACT

The spin transport device includes a semiconductor layer; a first ferromagnetic layer provided on the semiconductor layer via a first tunnel barrier layer; a second ferromagnetic layer provided on the semiconductor layer via a second tunnel barrier layer so as to be divided from the first ferromagnetic layer; and a first wire which generates, upon application of an electric current, a magnetic field in a region between the first ferromagnetic layer and the second ferromagnetic layer in the semiconductor layer.

12 Claims, 23 Drawing Sheets

Figure 1:
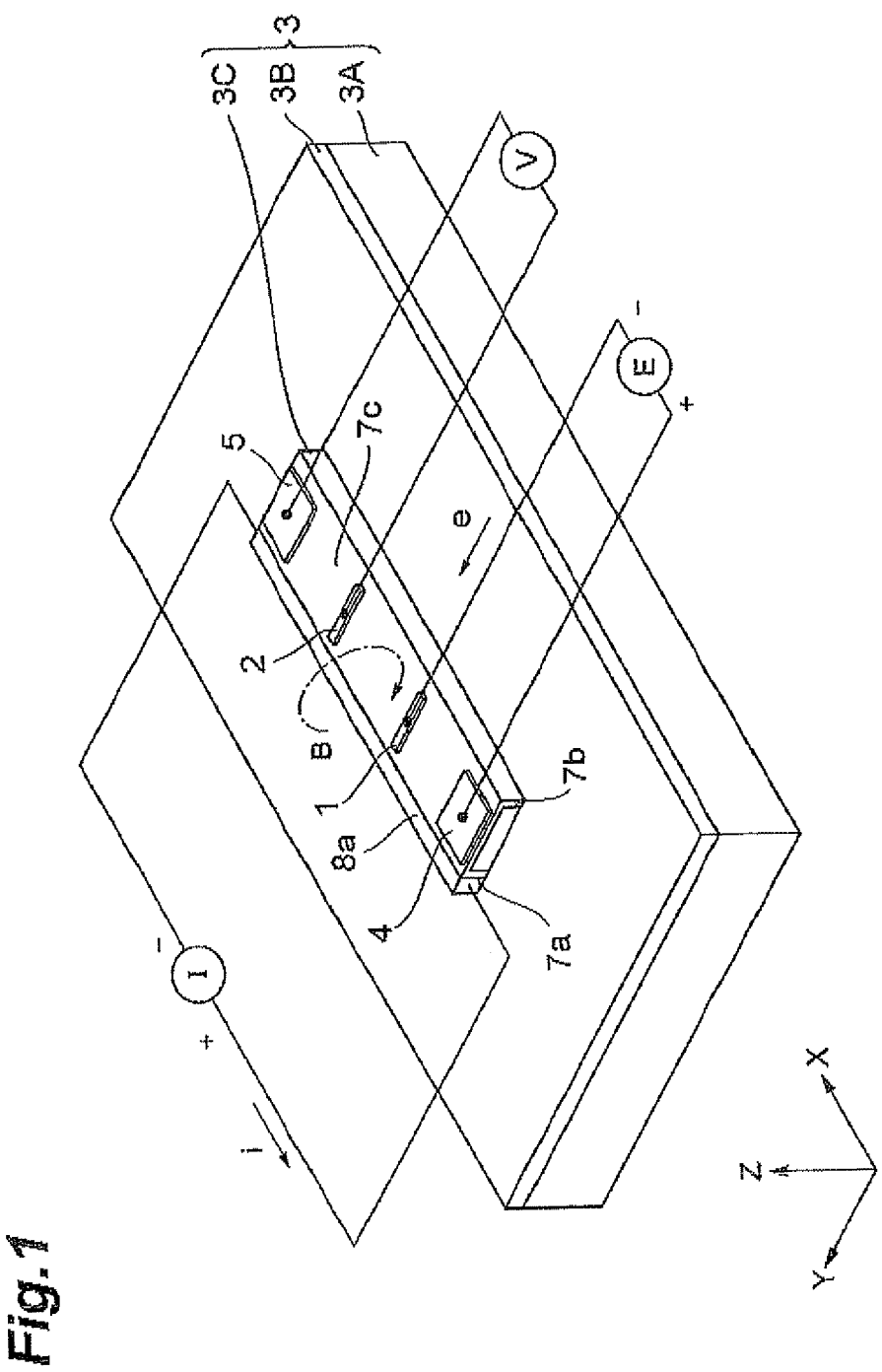

*Fig.22*
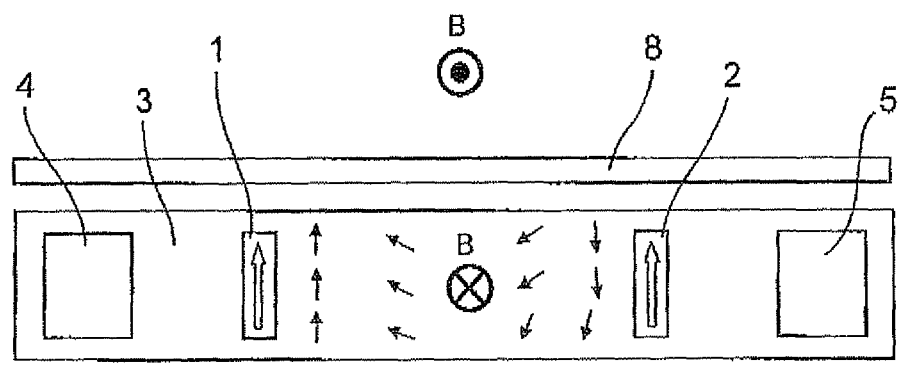
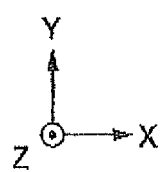

SPIN TRANSPORT DEVICE

BACKGROUND OF THE INVENTION

1. Field of the Invention

The present invention relates to a spin transport device using magnetic fields.

2. Related Background Art

Spin transport devices have been attracting the attention recently. As it had been conventionally believed that a flow of spins (spin current) is associated with an electric current, a flow of spins alone was previously unknown. A spin current associated with an electric current is utilized for broad product applications generally utilizing magnetoresistance effects. Such products include magnetic heads for hard disk drives (HDDs), magnetic sensors or magnetoresistive random access memories (MRAMs). Devices utilizing a conventional spin current associated with an electric current and devices utilizing a spin current alone are collectively called as spin transport devices.

Spin transport devices utilizing thin-film technology have also been attracting the attention. One of applications thereof is Spin-MOSFET (see Japanese Patent No. 4143644, Japanese Patent Application Laid-open No 2002-246487 and Japanese Patent Application Laid-open No. H09-097906). Other technologies relating to spin currents are described in, for example, Japanese Patent No. 3818276 and F. J. Jedema et. al., "Electrical detection of spin precession in a metallic mesoscopicspin valve", Nature, 416, 713, (2002).

However, when spins travel a long distance, the direction of spins may be easily affected by external magnetic fields. In such case, spins are forced to rotate even with a weak external magnetic field, resulting in modification during transmission of otherwise accurate magnetization information which depends on the direction of spins. Spins possess magnetization information at the initial stage of transmission, which depends on the magnetization direction of a ferromagnetic substance through which spins pass at the initial stage. When magnetization information modified during transmission is collected, accurate information is decreased and noise information is increased. Generally, increase in noise information is not preferred.

On the other hand, new technology may be developed if such adverse effect as modification of magnetization information could be exploited positively. However, it has been believed that it is impossible to exploit the phenomenon of modification of magnetization information, i.e. "Hanle effect", in a positive way because in order to induce "Hanle effect" for rewriting information, an external magnetic field perpendicular to the transmission direction of spins and to the magnetization direction of spins needs to be applied, while deviation of the external magnetic field from the perpendicular direction causes uneven rotation of spins relative to the external magnetic field; due to these, it may be difficult to accurately rewrite the information.

SUMMARY OF THE INVENTION

An aspect of the present invention aims to provide a new technology utilizing such propensity in a positive way.

In order to solve the above problem, a spin transport device according to an aspect of the present invention is characterized in that it comprises a semiconductor layer; a first ferromagnetic layer provided on the semiconductor layer via a first tunnel barrier layer; a second ferromagnetic layer provided on the semiconductor layer via a second tunnel barrier layer so as to be divided from the first ferromagnetic layer; and a first wire which generates, upon application of an electric current, a magnetic field in a region between the first ferromagnetic layer and the second ferromagnetic layer in the semiconductor layer.

The spin transport device employing a spin current can be used for temporal memories by controlling the spin current flowing between the first and second ferromagnetic layers by means of the magnetic field. In the spin transport device utilizing magnetoresistance effects, magnetoresistance between the first and second ferromagnetic layers can be controlled by controlling spins of the electric current flowing therebetween. Thus, this spin transport device can be used for temporal memories and the like.

The spin transport device according to the aspect of the present invention is characterized in that it comprises a first electrode provided at a position outside of the region between the first ferromagnetic layer and the second ferromagnetic layer on the semiconductor layer and on the side closer to the first ferromagnetic layer; a second electrode provided at a position outside of the region between the first ferromagnetic layer and the second ferromagnetic layer on the semiconductor layer and on the side closer to the second ferromagnetic layer; an electron flow source for applying electrons between the first ferromagnetic layer and the first electrode; and voltage measuring means for measuring voltage between the second ferromagnetic layer and the second electrode.

Electrons flow through the semiconductor layer when an electron flow is supplied between the first ferromagnetic layer and the first electrode from the electron flow source, while a spin current diffuses from the interface of the first tunnel bather layer and the semiconductor layer below the first ferromagnetic layer. This spin current flows toward the second ferromagnetic layer, and the second ferromagnetic layer senses, depending on the magnetization direction of the spins, the spins via the second tunnel bather layer, resulting in generation of voltage between the second ferromagnetic layer and the second electrode, which is then detected by the voltage measuring means. The application of an electric current to the first wire of the spin transport device generates a magnetic field around the first wire. If this magnetic field is applied in a region where the spins of the semiconductor layer travel, the direction of the spins is modified due to the magnetic field. Thus, by controlling the magnetic field, an electric potential of the spins sensed by the second ferromagnetic layer can be controlled. Accordingly, the spin transport device can be utilized as volatile memories which can rewrite information only upon application of magnetic fields in arithmetic circuits utilizing spin transport, or gate effect devices of a spin current. The first and second tunnel barrier layers may be a common layer.

The magnetization direction of the first ferromagnetic layer and the magnetization direction of the second ferromagnetic layer are the same and the direction of the magnetic field is perpendicular to the magnetization direction of the first or second ferromagnetic layer.

In this case, the direction of spins traveling out from the side of the first ferromagnetic layer is modified by the magnetic field generated by the electric current in the wire during traveling, so that the direction of the spins is significantly modified when the spins reach to the second ferromagnetic layer; thus the spin electric potential sensed at the second ferromagnetic layer can be significantly modified. Thus, output control by means of magnetic fields is more effective because the direction of the travelling spins is significantly affected by magnetic fields.

The spin transport device according to the aspect of the present invention is characterized in that it further comprises a first magnetic yoke surrounding the first wire. In this case, lines of magnetic force of the magnetic field generated around the first wire pass through the first magnetic yoke, thereby increasing the magnetic flux density in the first magnetic yoke. Accordingly, the magnetic field can be effectively generated in the semiconductor layer. In addition, the magnetic field perpendicular to the transporting spins can be applied due to the structure of the yoke, thereby making it possible to obtain effective rotation of the spins.

The spin transport device according to the aspect of the present invention is characterized in that it further comprises a second wire which is provided at a position flanking the semiconductor layer together with the first wire and generates, upon application of an electric current, a magnetic field in the region between the first ferromagnetic layer and the second ferromagnetic layer in the semiconductor layer.

In this case, magnetic fields surrounding not only the first wire, but also the second wire can be generated. The overlap of the magnetic fields can generate intense magnetic fields in the semiconductor layer. Thus, the spin direction can be more effectively controlled by the magnetic fields.

The present invention is characterized in that a second magnetic yoke surrounding the second wire is further provided. In this case, lines of magnetic force of the magnetic field generated around the second wire pass through the second magnetic yoke, thereby increasing the magnetic flux density in the second magnetic yoke. Accordingly, the magnetic field can be effectively generated in the semiconductor layer. The first and second magnetic yokes may be integrated.

The first and second tunnel barrier layers are characterized in that they are each formed of an insulating film or a Schottky barrier. The tunnel barrier layers constitute potential barriers having a thickness that allows tunneling of electrons, which is 2 nm or less according to the present embodiment. Electrons can tunnel insulating films or Schottky barriers having a thickness of 2 nm or less. Insulating films are superior to Schottky barriers because the thickness thereof can be more easily controlled.

The insulating film is characterized in that it is made of $MgO$, $Al_2O_3$ or $MgAl_2O_4$. These materials are advantageous due to high efficacy of spin injection and detection.

The second ferromagnetic layer is characterized in that it has a higher coercive force than the first ferromagnetic layer. In this case, the magnetization direction of the second ferromagnetic layer is less flexible compared to that of the first ferromagnetic layer. Accordingly, the spin transport device can be used for nonvolatile memory devices according to the magnetization directions of the first ferromagnetic layer and the second ferromagnetic layer, or rewritable logic devices.

The spin transport device according to the present aspect is characterized in that the magnetization direction of the second ferromagnetic layer is fixed by further comprising an antiferromagnetic layer exchange-coupled to the second ferromagnetic layer, and/or by conferring shape anisotropy to the second ferromagnetic layer. Due to these, the magnetization direction of the second ferromagnetic layer can be effectively fixed.

The spin transport device according to the aspect of the present invention can effectively utilize "Hanle effect", so that it can be used for nonvolatile memory devices according to the magnetization directions of the first ferromagnetic layer and the second ferromagnetic layer, volatile memory devices in rewritable logic devices or temporarily rewritable arithmetic devices utilizing spin transport.

The above aspect is not limited only to arithmetic devices utilizing spin transport. When magnetoresistance effects are utilized, which are combined effects of spin transport and electric current, the same effects can be obtained with the same structure as above except that the first electrode and the second electrode are omitted.

When magnetoresistance effects are utilized, the magnetization direction of the first ferromagnetic layer is anti-parallel to that of the second ferromagnetic layer, and the direction of the magnetic field is perpendicular to the magnetization direction of the first or second ferromagnetic layer. In this case, it is advantageous because the response to the perpendicular magnetic field is increased, so that higher modulation can be obtained with a weak magnetic field. When a spin current is utilized and the magnetization direction of the first ferromagnetic layer is parallel to that of the second ferromagnetic layer, the ferromagnetic layers can be easily produced by subjecting them to a heat treatment simultaneously while applying magnetic fields.

The spin transport device is also characterized in that it further comprises a semiconductor substrate on which the semiconductor layer is formed via an intermediate insulating layer, and voltage applying means for applying gate voltage to the semiconductor substrate. In this case, the amount of spins or electrons flowing between the first and second ferromagnetic layers can be controlled by means of gate voltage.

BRIEF DESCRIPTION OF TIM DRAWINGS

Figure 2:
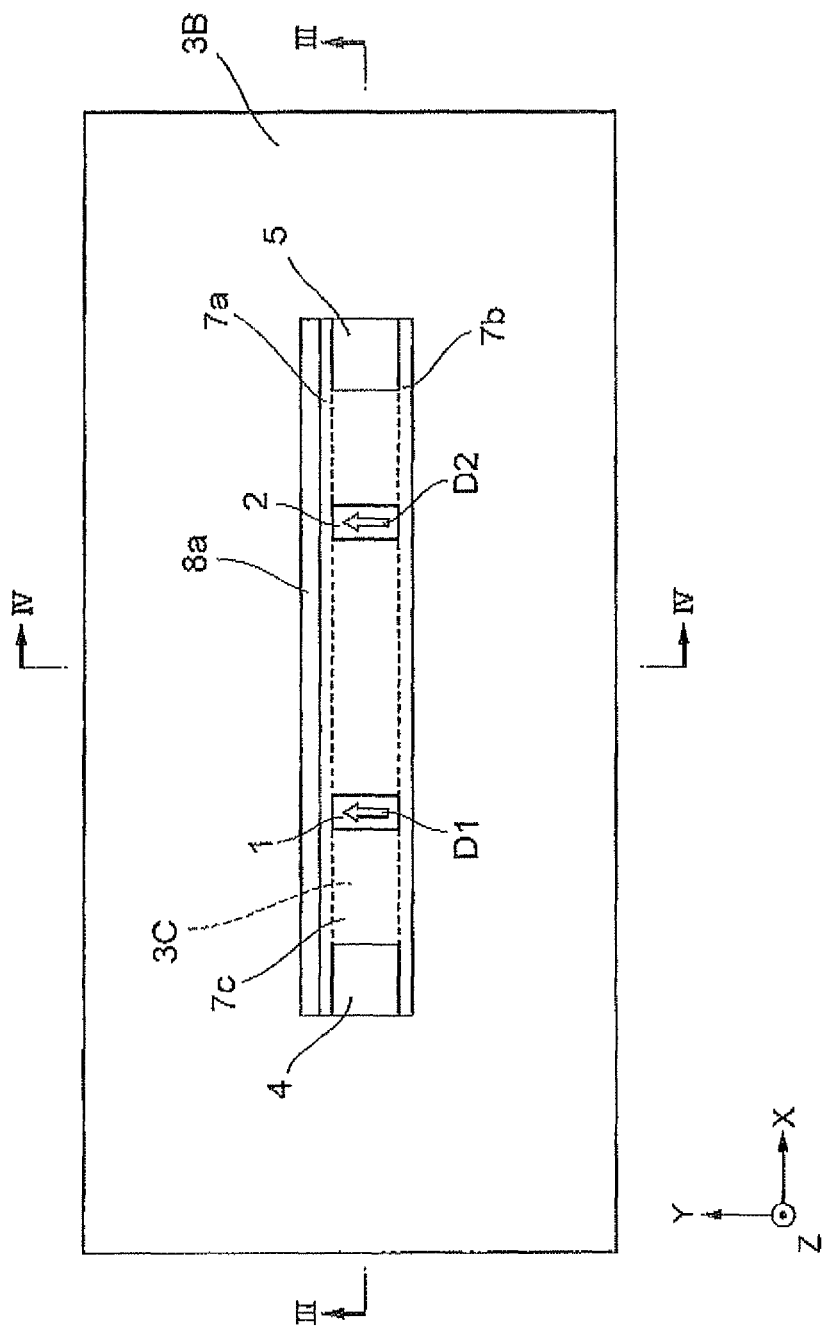
Figure 3:
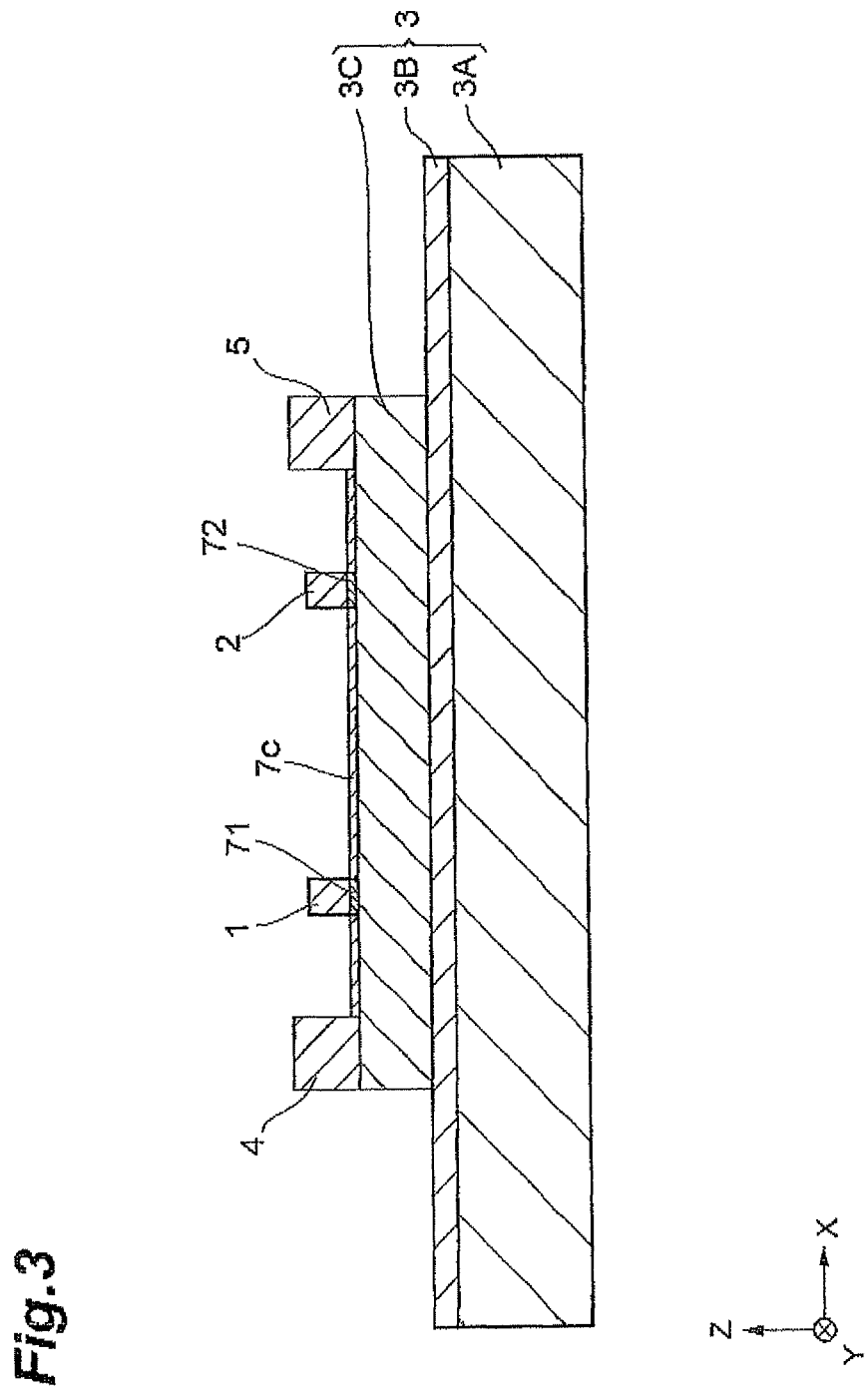
Figure 4:
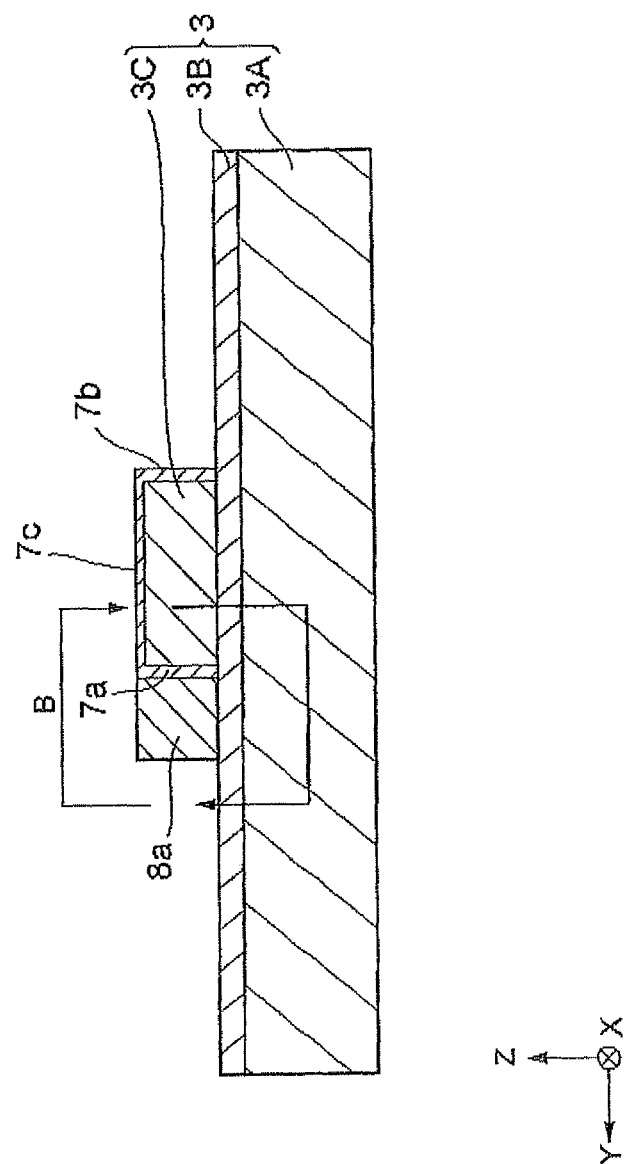
Figure 5:
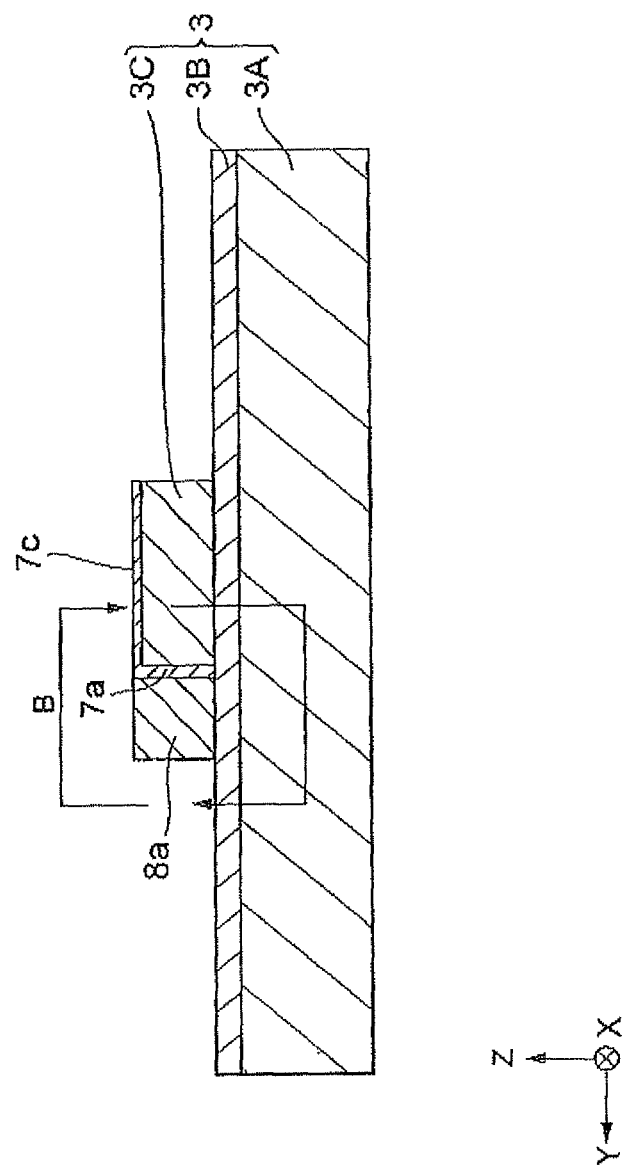
Figure 6:
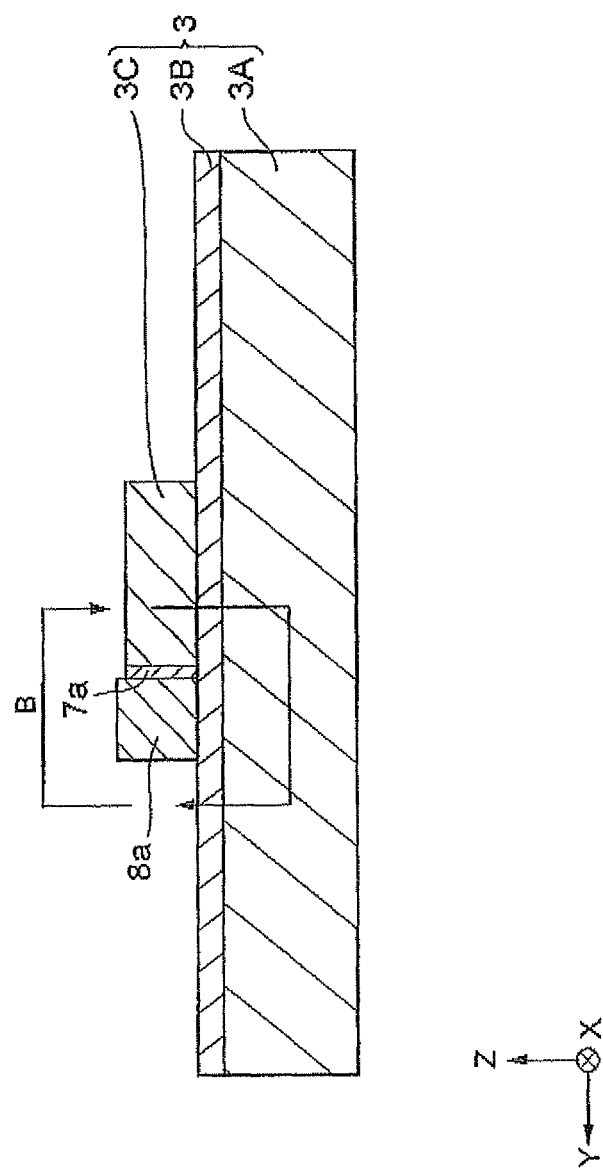
Figure 7:
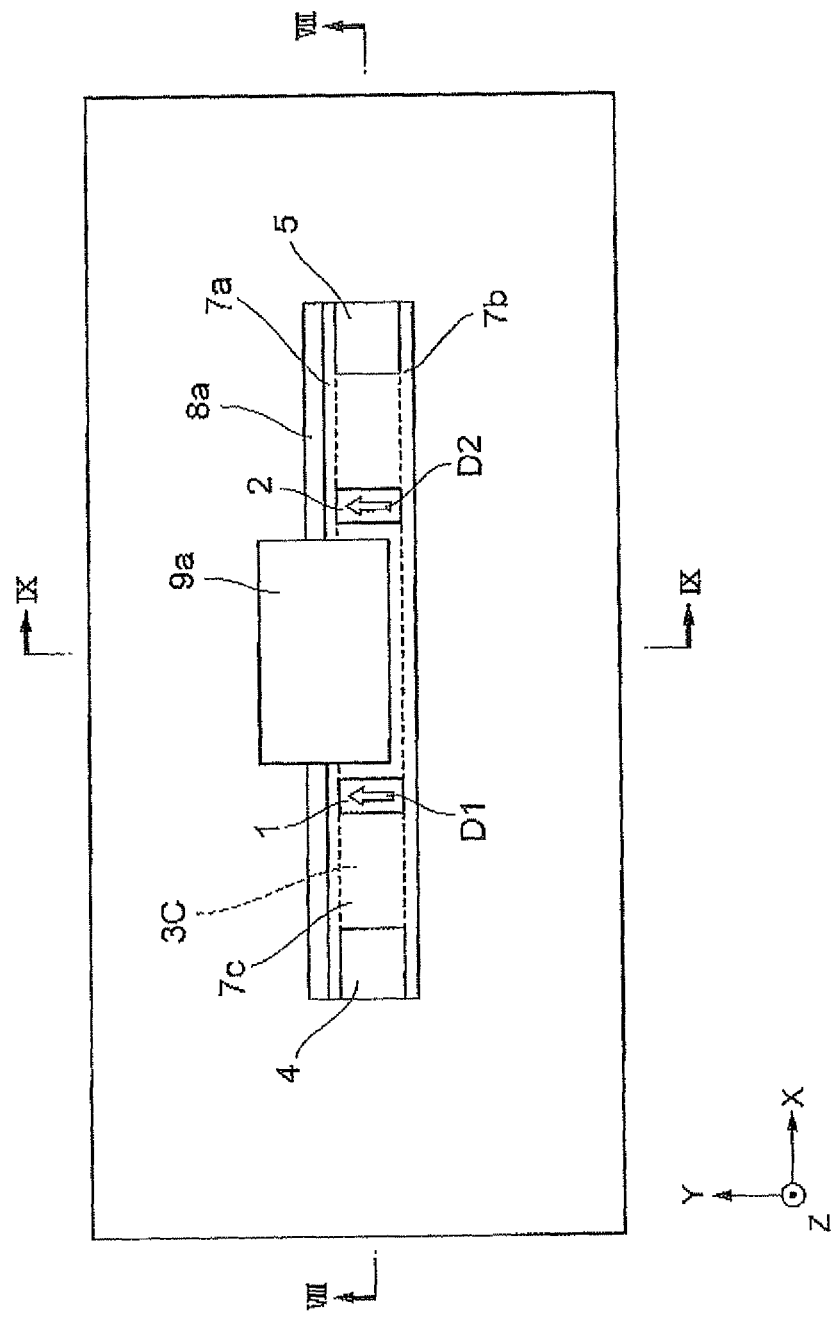
Figure 8:
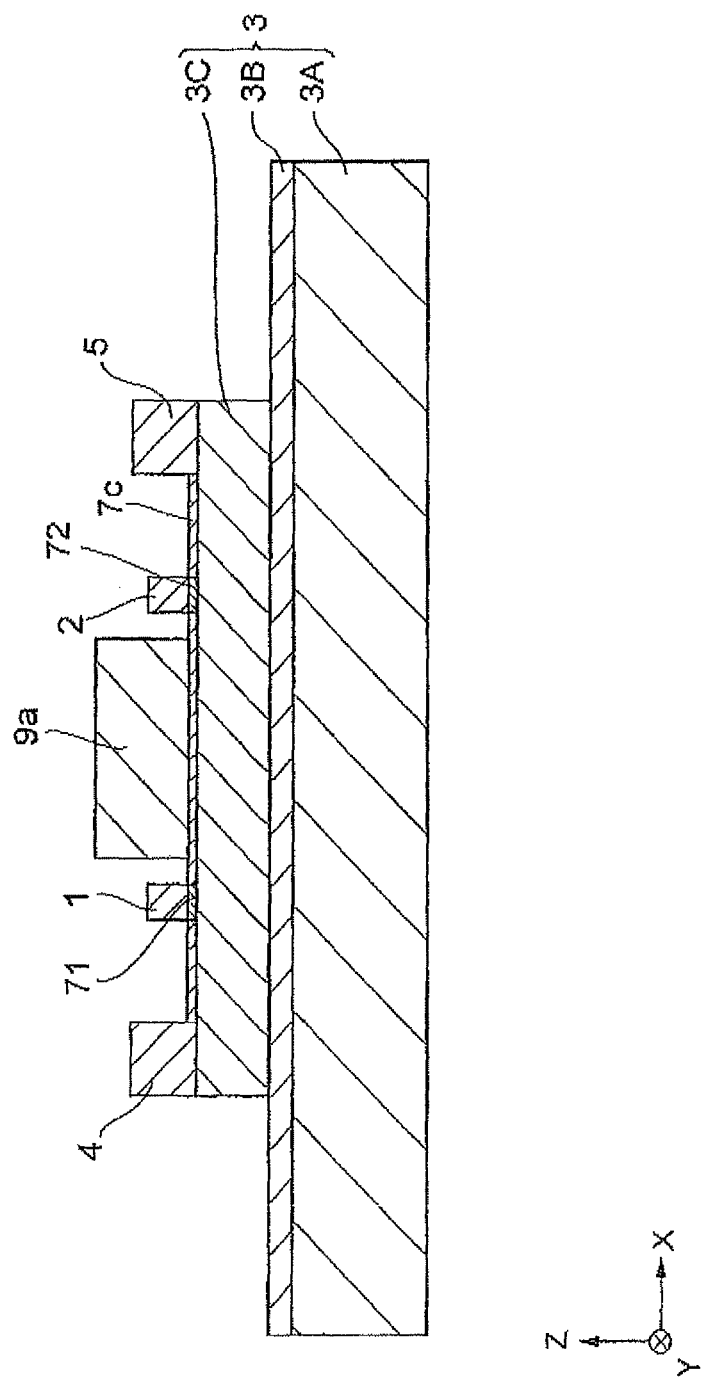
Figure 9:
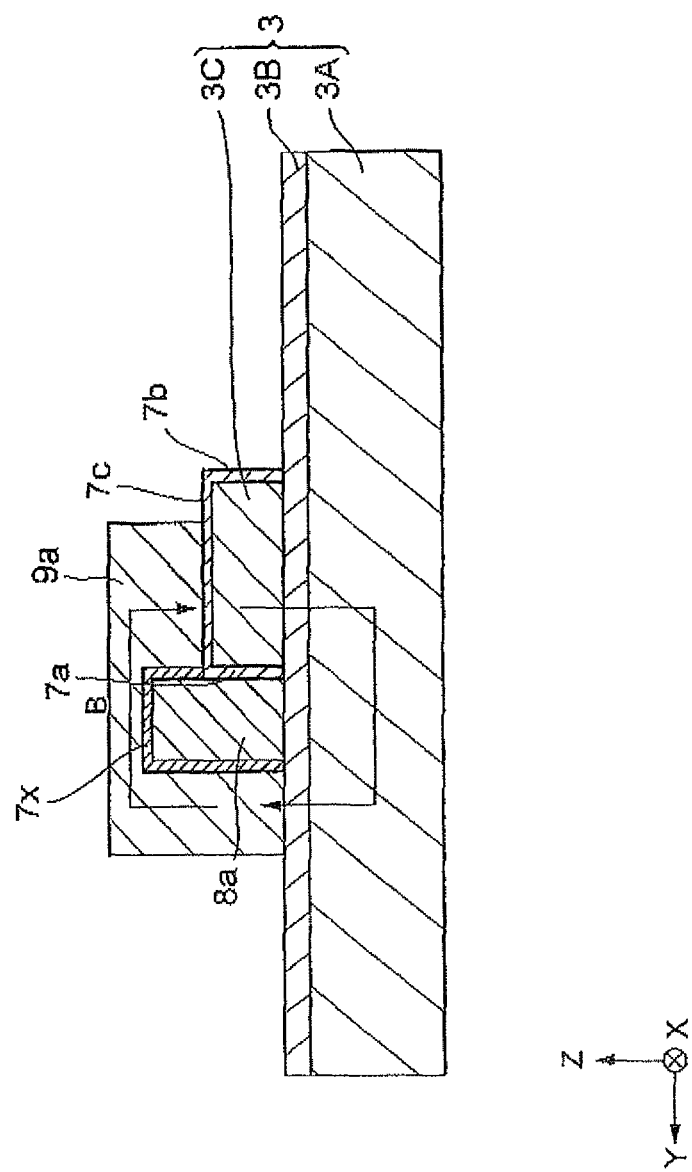
Figure 10:
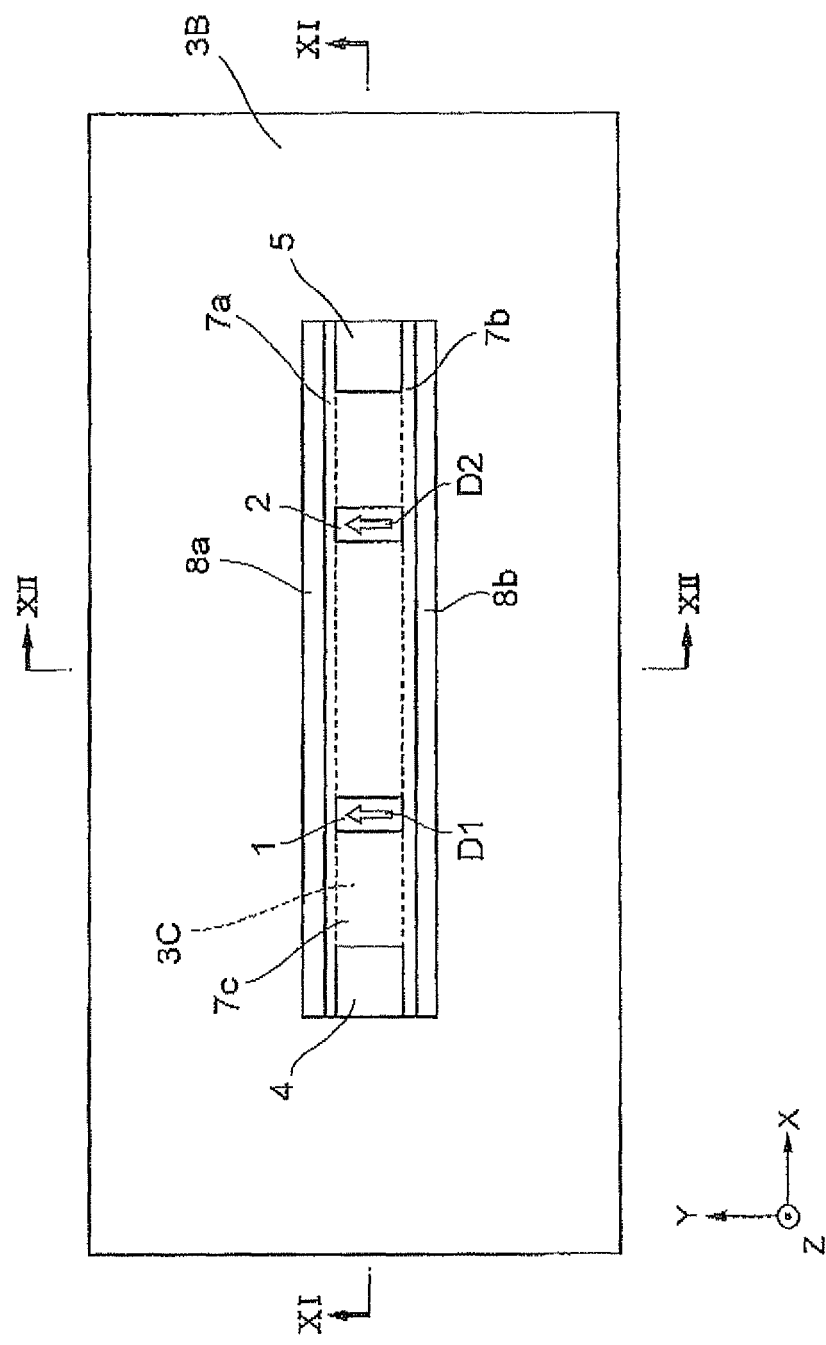
Figure 11:
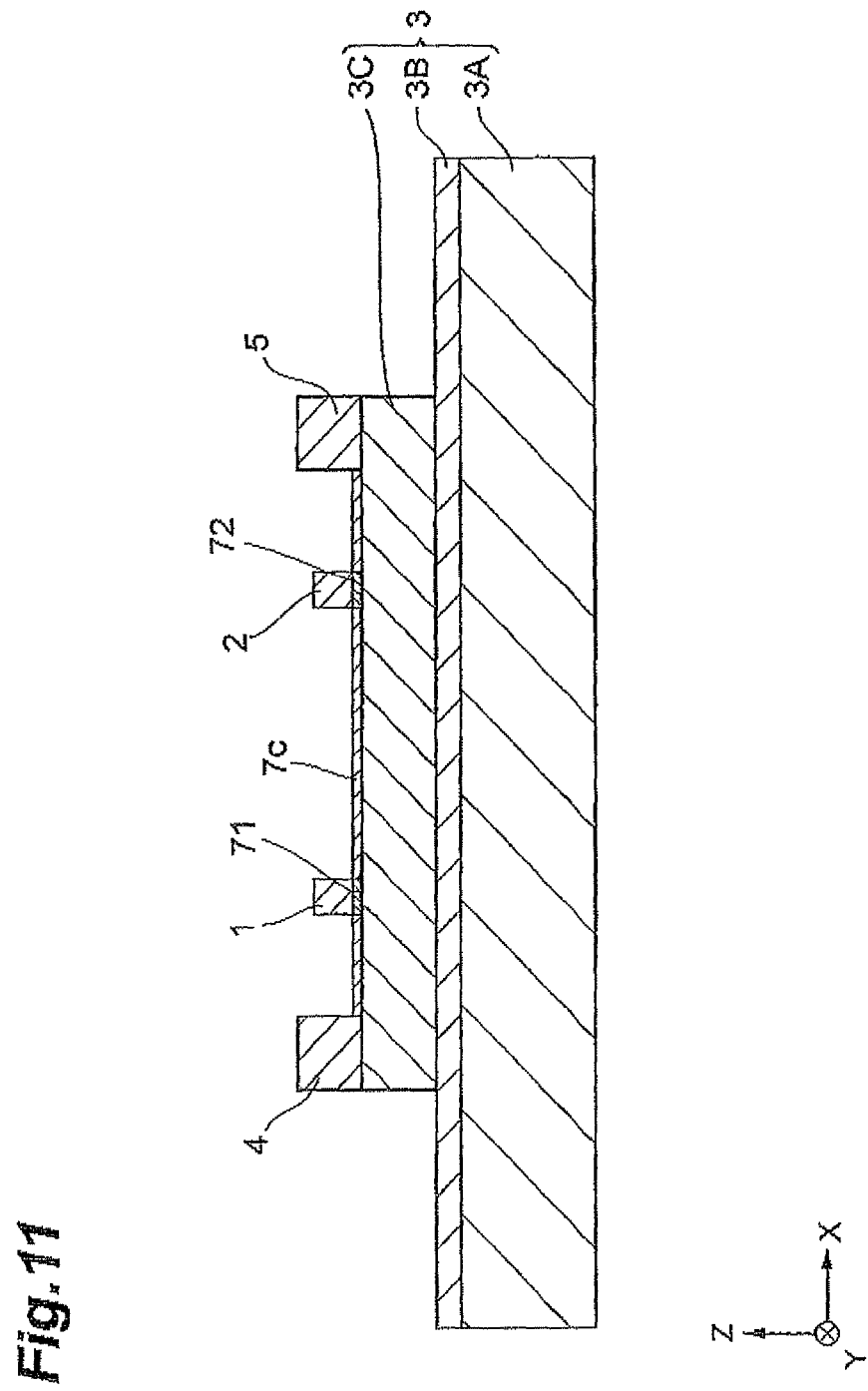
Figure 12:
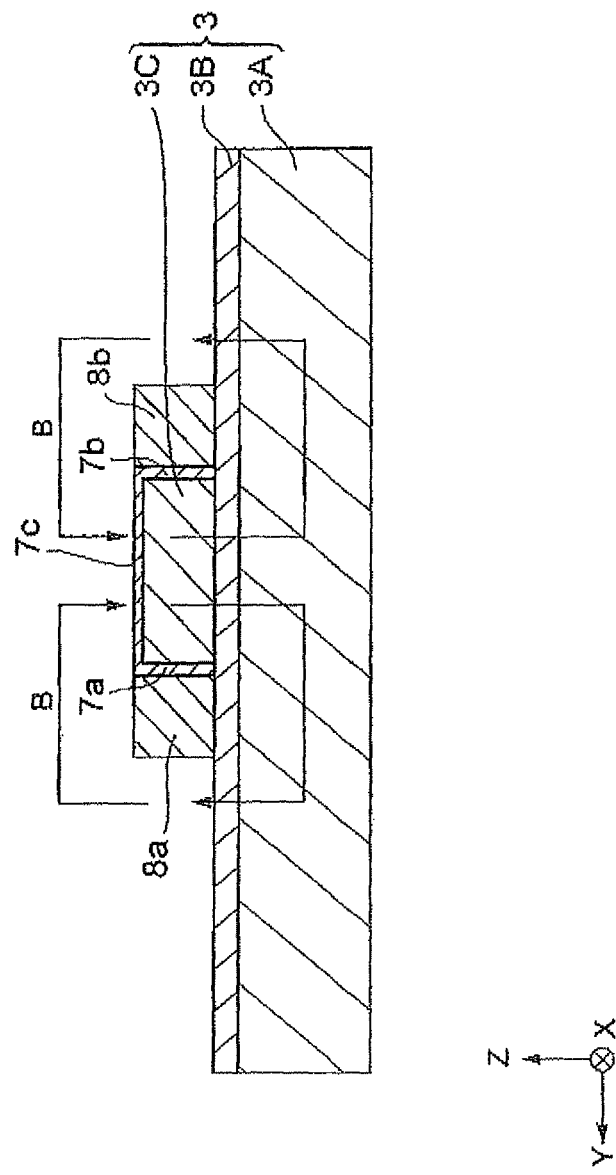
Figure 13:
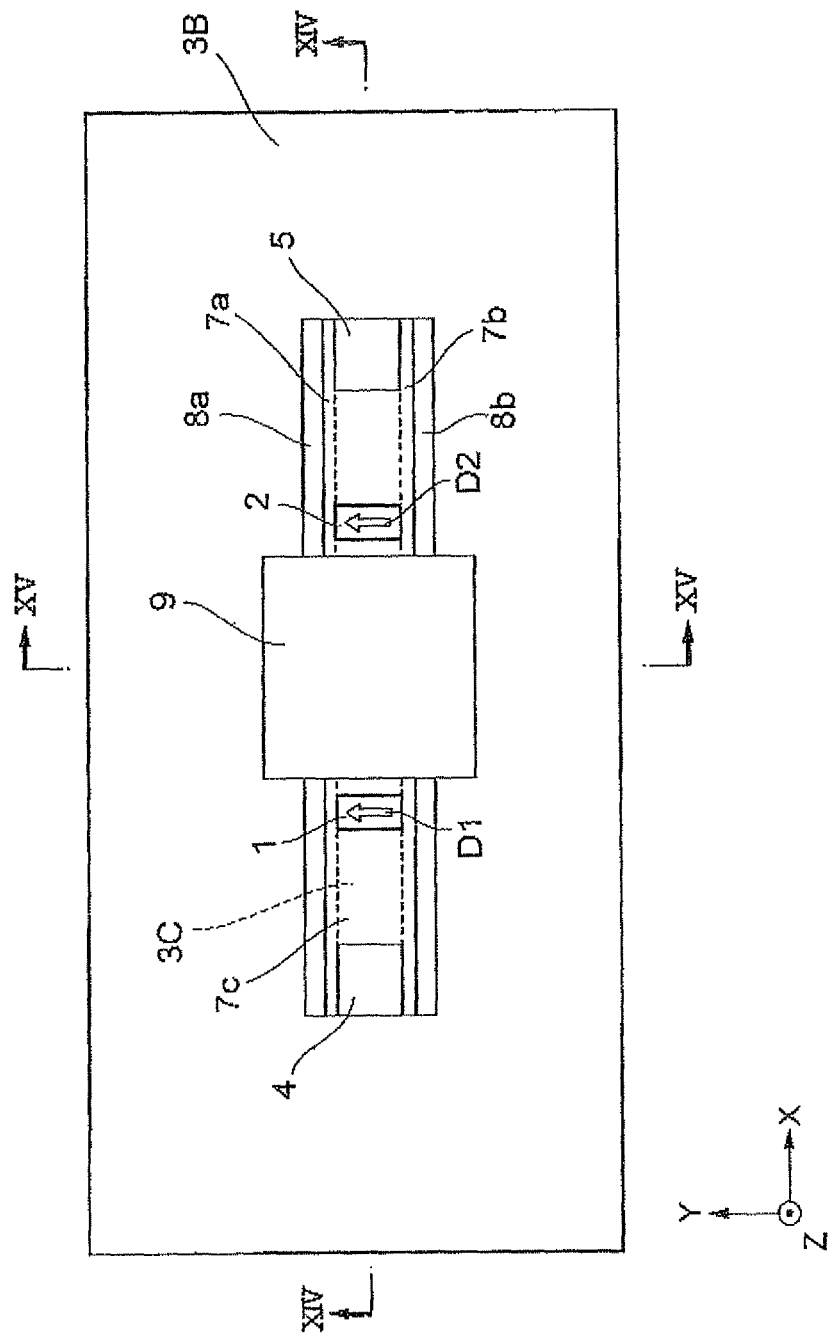
Figure 14:
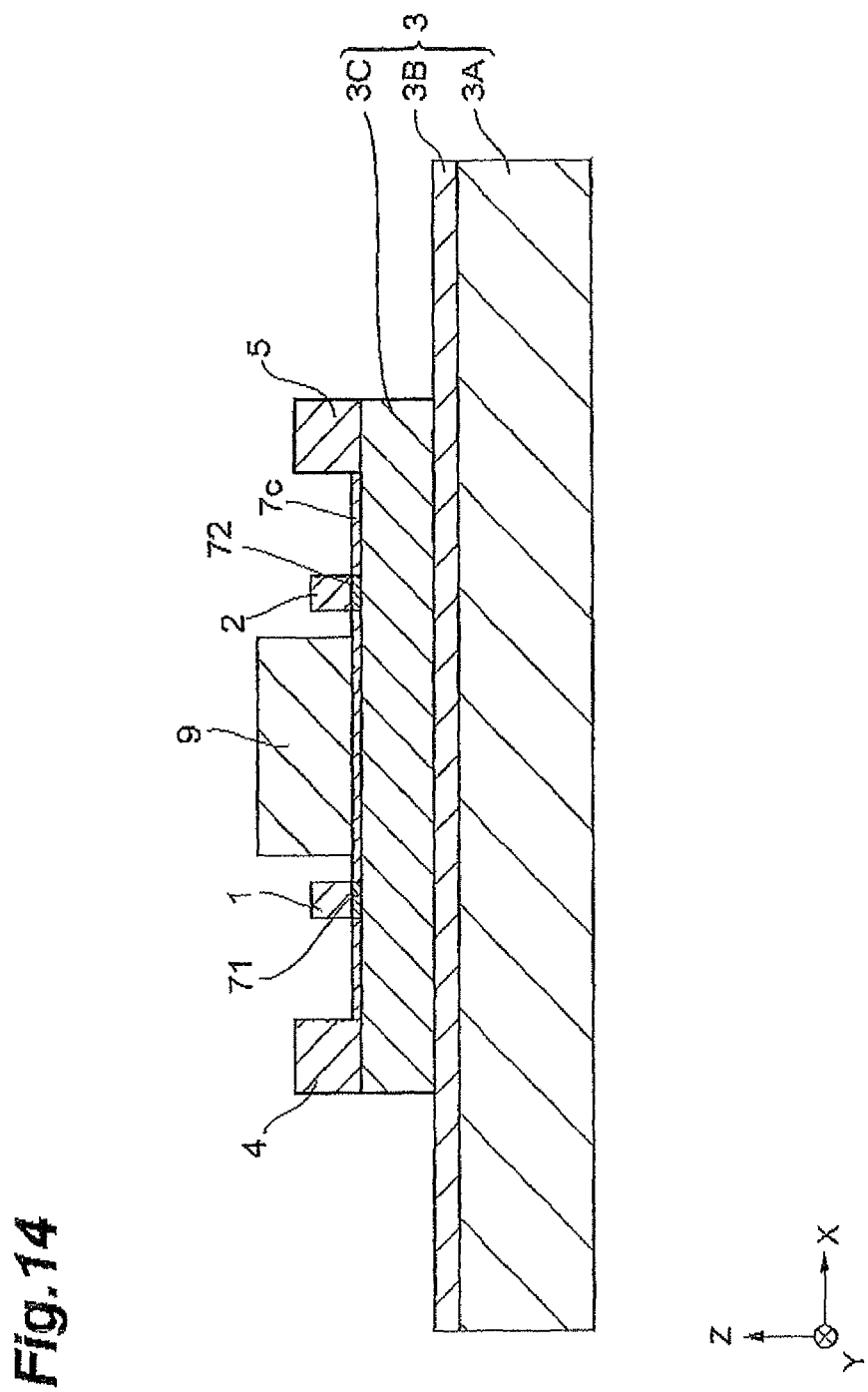
Figure 15:
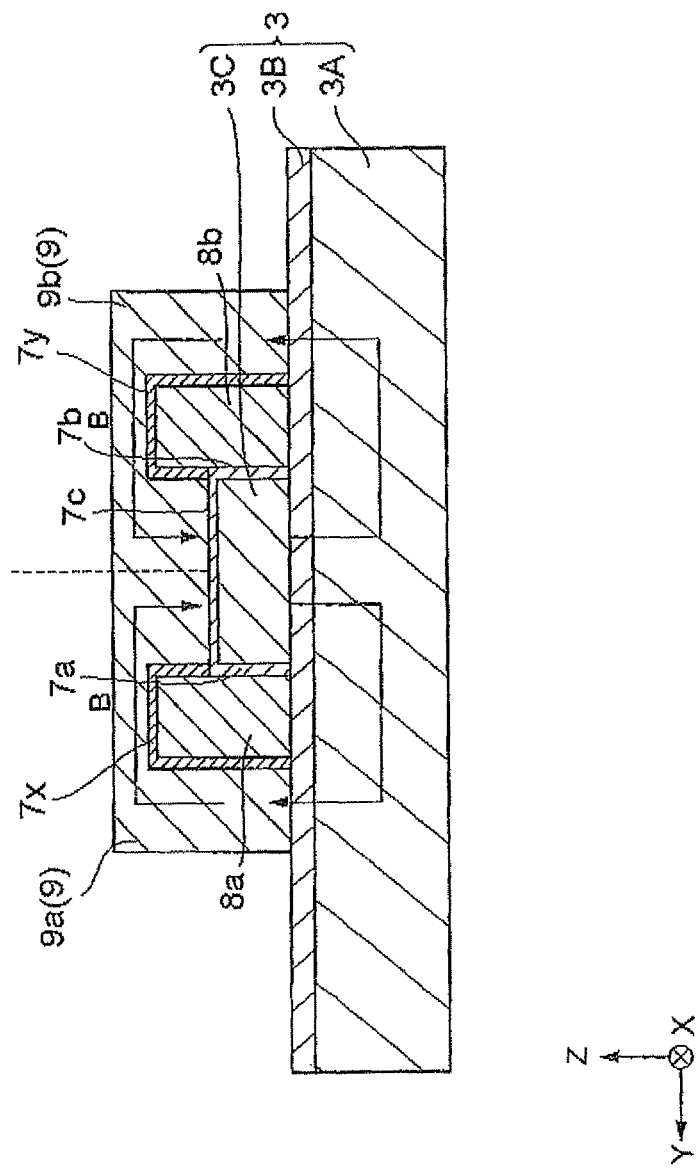
Figure 16:
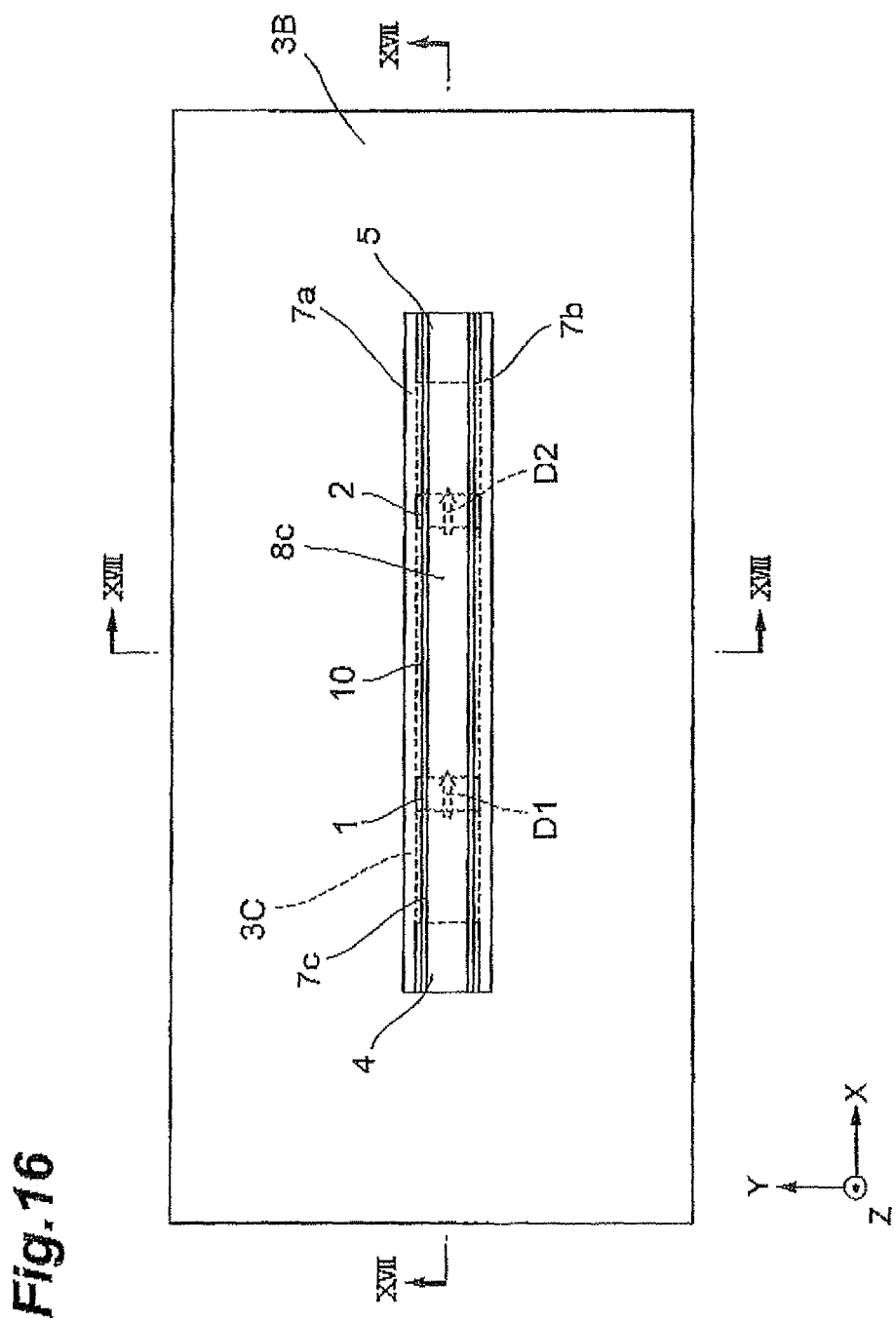
Figure 17:
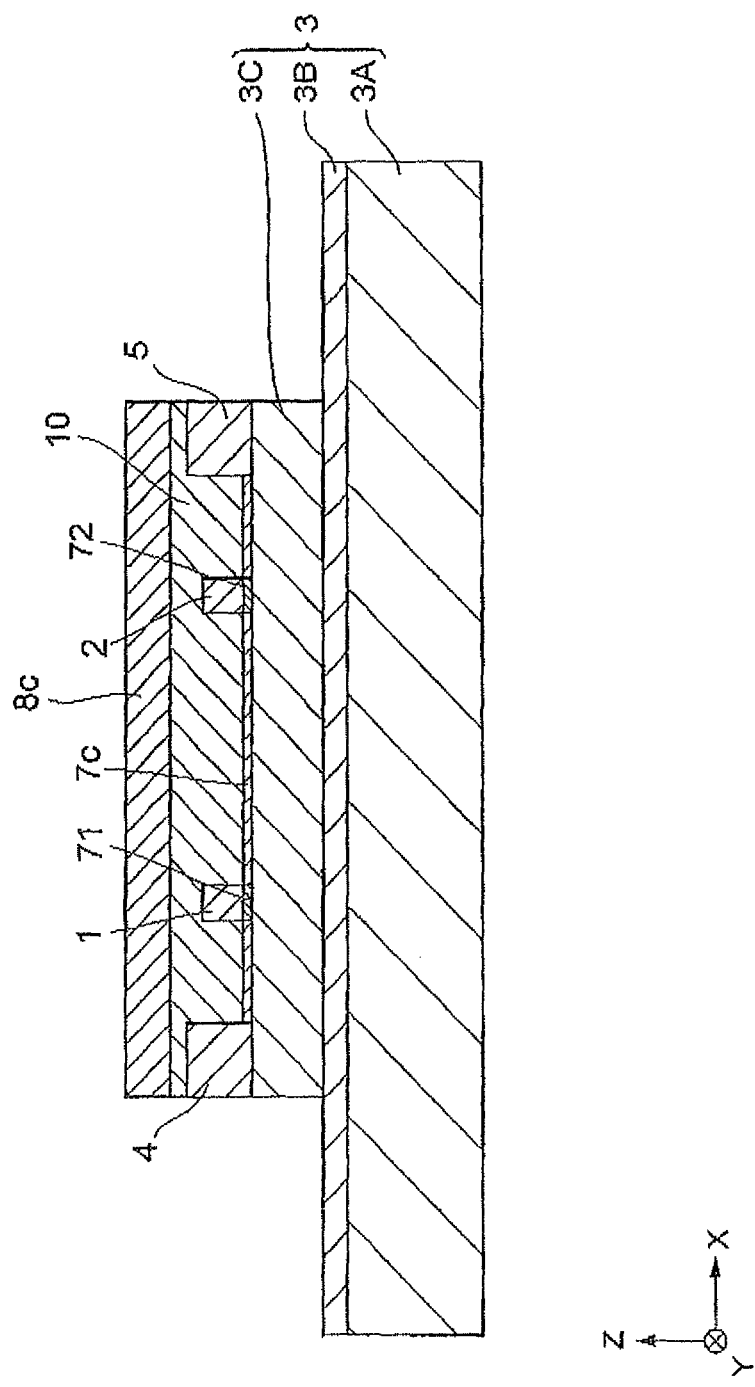
Figure 18:
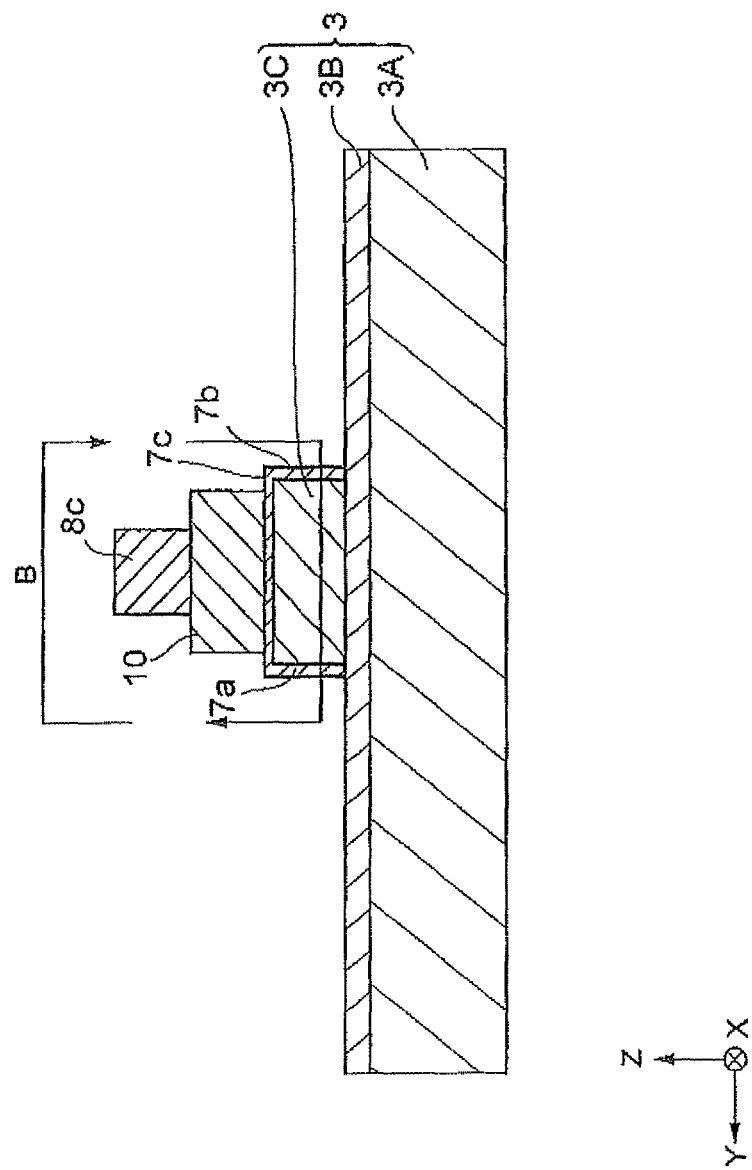
Figure 19:
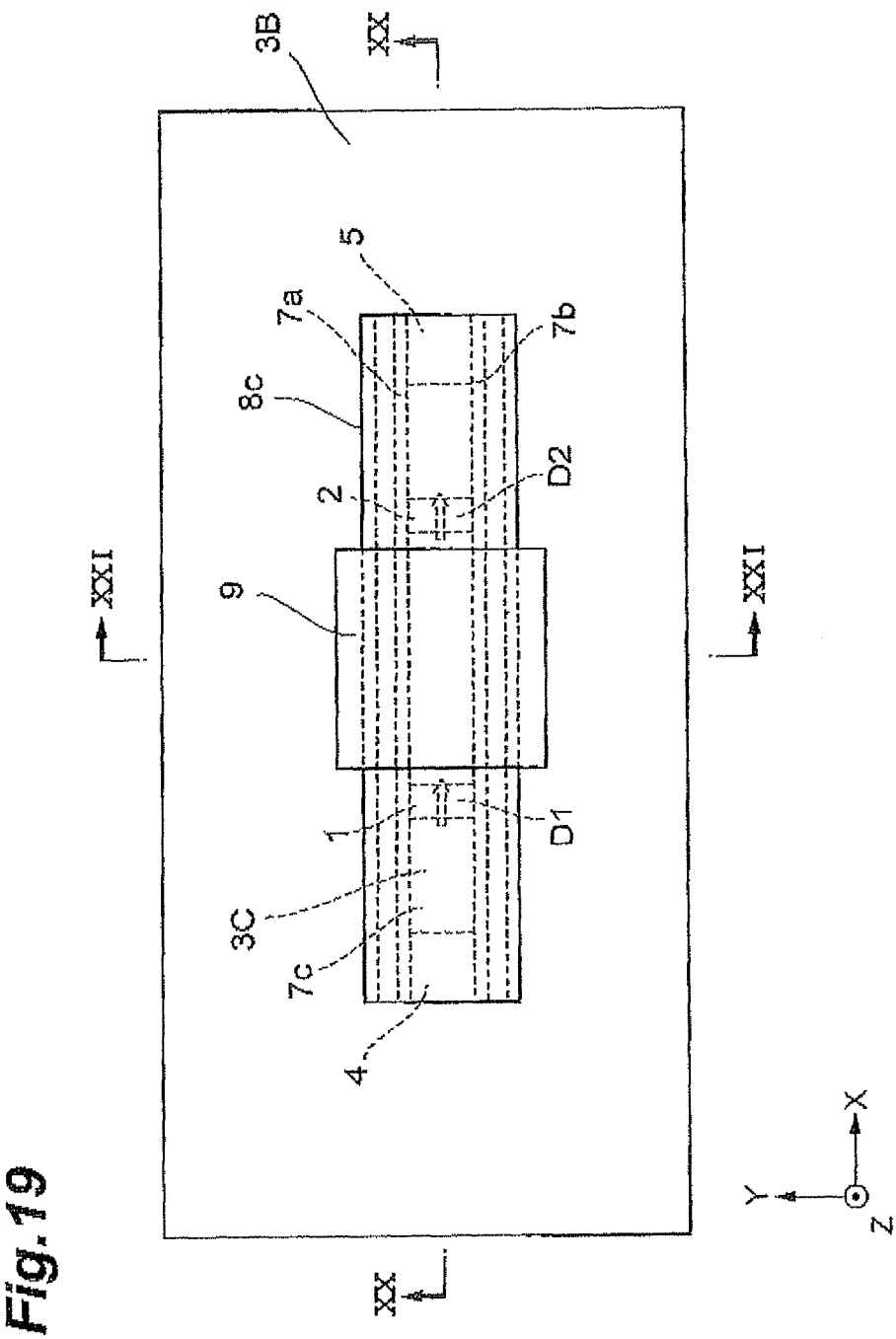
Figure 20:
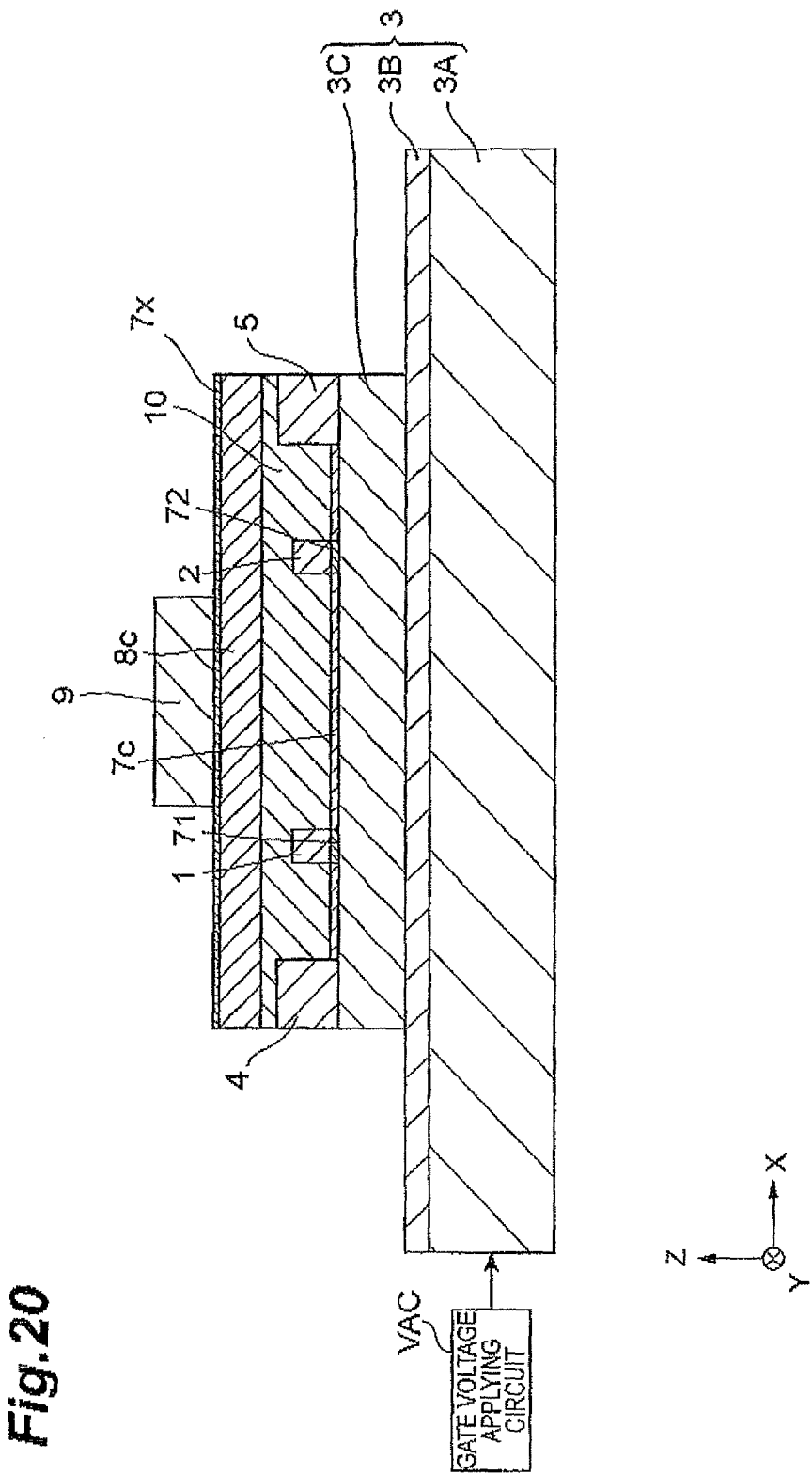
Figure 21:
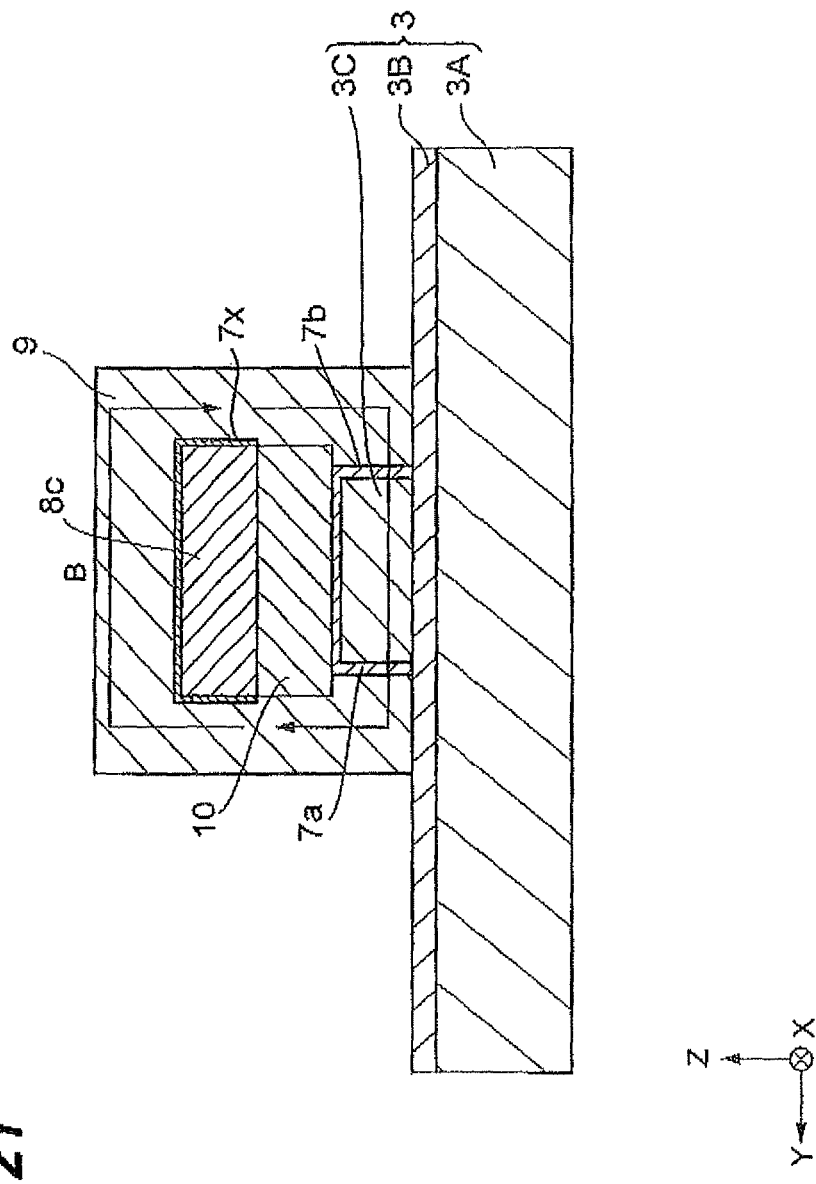
Figure 23A:
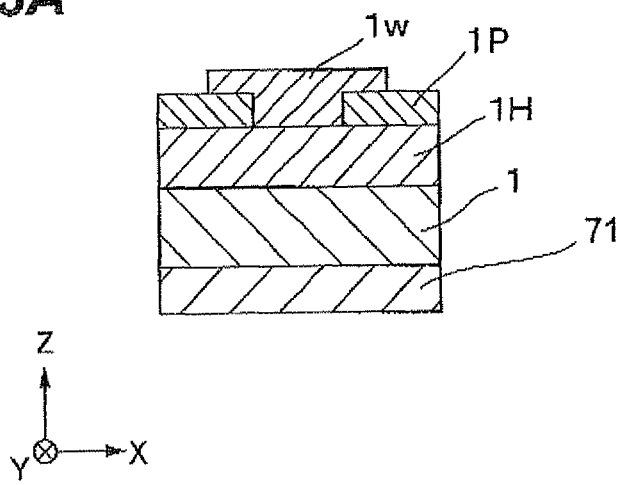
Figure 23B:
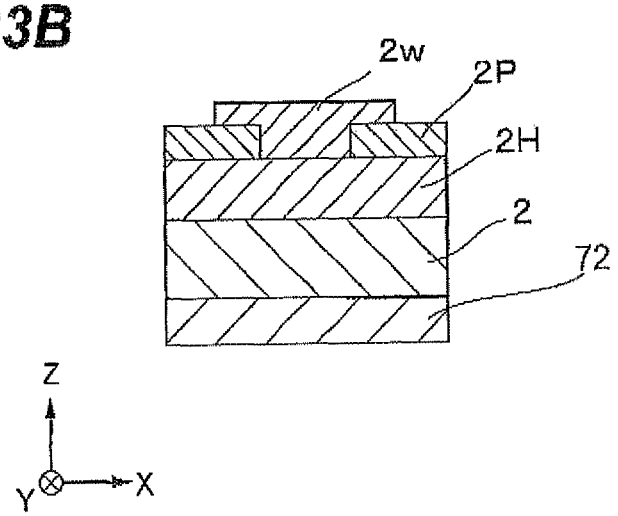

FIG. 1 is a perspective view of a spin transport device;
FIG. 2 is a plan view of the spin transport device;
FIG. 3 is a view of section III-III of the spin transport device;
FIG. 4 is a view of section IV-IV of the spin transport device;
FIG. 5 is a sectional view of a spin transport device (modification example);
FIG. 6 is a sectional view of a spin transport device (modification example);
FIG. 7 is a plan view of a spin transport device;
FIG. 8 is a view of section VIII-VIII of the spin transport device;
FIG. 9 is a view of section IX-IX of the spin transport device;
FIG. 10 is a plan view of a spin transport device;
FIG. 11 is a view of section XI-XI of the spin transport device;
FIG. 12 is a view of section of the spin transport device;
FIG. 13 is a plan view of a spin transport device;
FIG. 14 is a view of section XIV-XIV of the spin transport device;
FIG. 15 is a view of section XV-XV of the spin transport device;
FIG. 16 is a plan view of a spin transport device;
FIG. 17 is a view of section XVII-XVII of the spin transport device;
FIG. 18 is a view of section XVIII-XVIII of the spin transport device;
FIG. 19 is a plan view of a spin transport device;
FIG. 20 is a view of section XX-XX of the spin transport device;
FIG. 21 is a view of section XXI-XXI of the spin transport device;
FIG. 22 is a view for illustrating the direction of rotation of spins in a spin transport device; and
FIGS. 23A and 23B are vertical sectional views of ferromagnetic layers.

DESCRIPTION OF THE PREFERRED EMBODIMENTS

Spin transport devices according to the embodiments are illustrated hereinafter. The same component is designated with the same symbol, and redundant illustrations are omitted.

FIGS. 1 and 2 are respectively a perspective view and a plan view of a spin transport device according to the first embodiment, and FIGS. 3 and 4 are views of section III-III and section IV-IV, respectively, of the spin transport device. A 3-dimensional orthogonal coordinate system is created with a thickness direction of a substrate on Z-axis, and two axes perpendicular to the Z-axis on X- and Y-axes.

The spin transport device comprises a SOI (Silicon On Insulator) substrate 3. The SOI substrate 3 comprises a semiconductor substrate 3A, an intermediate insulating layer 3B and a semiconductor layer 3C, which are stacked one over another in this order. The semiconductor substrate 3A and the semiconductor layer 3C are made of Si, and the intermediate insulating layer 3B is made of $Al_2O_3$ or $SiO_2$.

The semiconductor layer 3C is etched in its periphery so as to obtain a rectangular prism shape. A first wire 8a for generating a magnetic field is provided in the vicinity of the semiconductor layer 3C. The first wire 8a is arranged side by side with the semiconductor layer 3C, with their longitudinal directions (X-axis directions) being the same and in parallel. The semiconductor layer 3C is surrounded by insulating films 7a, 7b and 7c. The insulating films 7a, 7b and 7c are in this example made of $SiO_2$, while they may be made of SiNx, MgO, $Al_2O_3$ or $MgAl_2O_4$. Although no insulating film is provided at either end of the semiconductor layer 3C in the longitudinal direction in this figure, both ends may be covered with insulating films.

The side surfaces of the semiconductor layer 3C are covered with insulating films 7a and 7b, and the upper surface thereof is covered with the insulating film 7c. The first wire 8a is provided on the side surface of the semiconductor layer 3C via the insulating film 7a.

The spin transport device also comprises, as shown in FIG. 3, a first ferromagnetic layer 1, a first electrode 4, a second ferromagnetic layer 2 and a second electrode 5, which are arranged along the X-axis in this order. The first ferromagnetic layer 1 is provided on the semiconductor layer 3C via a first tunnel barrier layer 71. The first electrode 4 is provided on the semiconductor layer 3C in the vicinity of the first ferromagnetic layer 1. The second ferromagnetic layer 2 is provided on the semiconductor layer 3C via a second tunnel barrier layer 72 so as to be divided from the first ferromagnetic layer 71. The second electrode 5 is provided on the semiconductor layer 3C in the vicinity of the second ferromagnetic layer 2.

The first wire 8a generates a magnetic field B in a region between the first ferromagnetic layer 1 and the second ferromagnetic layer 2 on the semiconductor layer 3C by applying an electric current i through the first wire 8a from an electric current source I. The electric current source I is electrically connected to both ends of the first wire 8a. The magnetic field B is generated in the direction surrounding the X-axis; thus the magnetic flux through the semiconductor layer 3C is parallel to the thickness direction.

The spin transport device utilizing a spin current comprises, as shown in FIG. 1, an electron flow source E for applying electrons e between the first ferromagnetic layer 1 and the first electrode 4 and a voltage measuring circuit (means) V for measuring voltage between the second ferromagnetic layer 2 and the second electrode 5.

The electron flow source E supplies a flow of electrons between the first ferromagnetic layer 1 and the first electrode 4, so that electrons flow through the semiconductor layer 3C. In this example, electrons flow from the first ferromagnetic layer 1 to the first electrode 4 (an electric current flows in an opposite direction), thereby generating spins in a region of the semiconductor immediately below the first ferromagnetic layer 1. Thus, a spin current is diffused from the interface between the first tunnel barrier layer 71 and the semiconductor layer 3C below the first ferromagnetic layer 1. This spin current also flows toward the second ferromagnetic layer 2, and the second ferromagnetic layer 2 responses to an electric potential generated by the spin current, depending on the magnetization direction of the spins, via the second tunnel barrier layer 72, resulting in generation of voltage between the second ferromagnetic layer 2 and the second electrode 5. The voltage is detected by the voltage measuring circuit V.

FIG. 22 is a view for illustrating the direction of rotation of spins in the spin transport device.

When an electric current is applied to the first wire 8a in the spin transport device, a magnetic field B is generated around the wire. When the magnetic field B is applied in a region where spins travel in the semiconductor layer 3C, the magnetic field modifies the direction of spins as shown by arrows in FIG. 22. Thus, by controlling the magnetic field, a spin electric potential sensed by the second ferromagnetic layer can be controlled. Accordingly, the spin transport device can be used for nonvolatile memory devices according to the magnetization directions of the first ferromagnetic layer and the second ferromagnetic layer, volatile memory devices in rewritable logic devices, or temporarily rewritable arithmetic devices utilizing spin transport. The first tunnel barrier layer 71 and the second tunnel barrier layers 72 shown in FIG. 3 may be a common layer.

As shown in FIG. 2, the magnetization direction D1 of the first ferromagnetic layer 1 is the same as the magnetization direction D2 of the second ferromagnetic layer 2, which are both oriented to the positive direction of the Y-axis. The direction of the magnetic field B in the semiconductor layer 3C is perpendicular to the magnetization direction D1 or D2 of the first or second ferromagnetic layer 1 or 2.

In this case, the direction of spins traveling out from the side of the first ferromagnetic layer 1 is modified by the magnetic field B generated by the electric current in the wire 8a while spins are traveling through the semiconductor layer 3C, so that the direction of the spins is significantly modified when spins reach to the second ferromagnetic layer 2; thus the spin electric potential sensed at the second ferromagnetic layer can be significantly modified (see FIG. 22). Thus, output control by means of magnetic field B can be more effective because the direction of the travelling spins is significantly affected by the magnetic field B.

The first tunnel barrier layer 71 and the second tunnel barrier layer 72 are formed of insulating films. These tunnel barrier layers may be formed of Schottky barriers (a semiconductor layer containing a metal layer attached thereto). The tunnel barrier layers constitute potential barriers having a thickness that allows tunneling of electrons, which is 2 nm or less according to the present example. Electrons can tunnel insulating films or Schottky barriers having a thickness of 2 nm or less. Insulating films are superior to Schottky barriers because the thickness thereof can be more easily controlled.

The insulating films constituting the first tunnel barrier layer 71 and the second tunnel barrier layer 72 are made of MgO, $Al_2O_3$ or $MgAl_2O_4$. These materials are advantageous due to high efficacy of spin tunneling, and spin injection and detection.

The first tunnel barrier layer 71 and the second tunnel barrier layer 72 may be a common layer together with the insulating film 7c for coating.

As shown in FIG. 5, the insulating film 7b may be omitted among the insulating films 7a, 7b and 7c, or as shown in FIG. 6, the insulating films 7b and 7c may be omitted.

FIG. 7 is a plan view of a spin transport device according to the second embodiment, and FIGS. 8 and 9 are views of sections VIII-VIII and IX-IX, respectively, of the spin transport device.

The spin transport device of the second embodiment further comprises a first magnetic yoke 9a surrounding the first wire 8a. The magnetic yoke 9a may be made of a material such as a ferromagnetic substance consisting of a metal containing at least one element among Ni, Fe and Co, for example, NiFe. The configuration of the spin transport device of the second embodiment is different from that of the first embodiment in that the former comprises the first magnetic yoke 9a and an insulating layer 7x is provided between the magnetic yoke 9a and the wire 8c. Other than these respects, the spin transport device of the second embodiment is the same as that of the first embodiment. The insulating layer 7x is made of, for example, an organic insulating material such as $SiO_2$ or SINx.

In the spin transport device of the second embodiment, lines of magnetic force of the magnetic field B generated around the first wire 8a pass through the first magnetic yoke 9a, resulting in increase in the magnetic flux density of the first magnetic yoke 9a. Accordingly, the magnetic field B can be effectively formed in the semiconductor layer 3C.

The magnetic yoke 9a has a rectangular shape as viewed from the direction of the Z-axis (FIG. 7), also a rectangular shape as viewed from the Y-axis (FIG. 8), and has a shape where a part of a side of a square is absent as viewed from the X-axis (FIG. 9). The magnetic yoke 9a is arranged so as to surround the first wire 8a with the X-axis as a center, and also covers a region of the semiconductor layer 3C between the first ferromagnetic layer 1 and the second ferromagnetic layer 2. In other words, according to the present embodiment, the semiconductor layer 3C is arranged within a magnetic circuit of the magnetic yoke 9.

FIG. 10 is a plan view of a spin transport device according to the third embodiment, and FIGS. 11 and 12 are views of sections XI-XI and XII-XII, respectively, of the spin transport device.

The spin transport device of the third embodiment comprises a second wire 8b. The second wire 8b is provided at a position flanking the semiconductor layer 3C together with the first wire 8a, and generates a magnetic field B upon application of an electric current in a region between the first ferromagnetic layer 1 and the second ferromagnetic layer 2 in the semiconductor layer 3C. The configuration of the spin transport device of the third embodiment is the same as that of the first embodiment except that it comprises the second wire 8b.

In this case, magnetic fields surrounding not only the first wire 8a, but also the second wire 8b can be generated. The overlap of these magnetic fields B can generate intense magnetic fields in the semiconductor layer with small electric current. Thus, the spin direction can be more effectively controlled by the magnetic fields B. The directions of the electric currents flowing through the first wire 8a and the second wire 8b are opposite, and the directions of rotation of the magnetic fields are also opposite. The first wire 8a is provided with the electric current from the electric current source, and the second wire 8b is also provided with the electric current from an electric current source which is not shown.

FIG. 13 is a plan view of a spin transport device according to the fourth embodiment, and FIGS. 14 and 15 are views of sections XIV-XIV and XV-XV, respectively, of the spin transport device.

The spin transport device of the fourth embodiment is different from that of the third embodiment in that it further comprises a second magnetic yoke 9 and that insulating layers 7x and 7y are provided between the magnetic yoke 9 and the wires 8a and 8b, respectively. The configuration of the spin transport device of the fourth embodiment is otherwise the same as that of the third embodiment. Insulating layers 7x and 7y are made of, for example, an organic insulating material such as $SiO_2$ or SiNx.

The magnetic yoke 9 of the present example has a shape such that the first magnetic yoke 9a and the second magnetic yoke 9b are integrated. A hypothetical border between the magnetic yokes 9a and 9b is shown as a dashed line in FIG. 15. The fundamental shape of the first magnetic yoke 9a is basically the same as that of the magnetic yoke shown in the second embodiment except that the former has a slightly shorter length in the Y-axis. The shape of the second magnetic yoke 9b is the same as that of the first magnetic yoke 9a, and the magnetic yokes 9a and 9b are in mirror symmetry with respect to the YZ plane.

The first magnetic yoke 9a and the second magnetic yoke 9b surround the first wire 8a and the second wire 8b around the X-axis, respectively. Lines of magnetic force of the magnetic field B generated around the first wire 8a pass through the first magnetic yoke 9a, thereby increasing the magnetic flux density in the first magnetic yoke 9a. Lines of magnetic force of the magnetic field generated around the second wire 8b also pass through the second magnetic yoke 9b, thereby again increasing the magnetic flux density in the second magnetic yoke 9b. Due to such overlap of the magnetic fields B, it is possible to effectively form the magnetic fields B in the semiconductor layer 3C. Although the first magnetic yoke 9a and the second magnetic yoke 9b are integrated, they may be separately formed.

FIG. 16 is a plan view of a spin transport device according to the fifth embodiment, and FIGS. 17 and 18 are views of sections XVII-XVII and XVIII-XVIII, respectively, of the spin transport device.

The spin transport device of the fifth embodiment is different from that of the first embodiment in that it has a third wire 3C, instead of the first wire 8a, above the semiconductor layer 3C, and the magnetization directions D1 and D2 of the first ferromagnetic layer 1 and the second ferromagnetic layer 2 are oriented to the positive direction of the X-axis. A coating layer 10 is provided between the insulating film 7c and the third wire 8c for planarization of the surface, and the third wire 8c is formed on the surface of the coating layer 10 formed on the semiconductor layer 3C and extends along the X-axis direction. The spin transport device according to the fifth embodiment is otherwise the same as that of the first embodiment. The coating layer 10 is made of an appropriate insulating material, which may be an inorganic insulating material such as $SiO_2$ or SiNx, or an organic material such as photoresists.

An electric current is applied to the third wire 8c from an electric current source and it flows along the X-axis. The magnetic field B is generated having lines of magnetic force surrounding the X-axis around the third wire 8c. The magnetization directions of D1 and D2 are perpendicular to the direction of the magnetic field B in the semiconductor layer 3C. In this case, the magnetic field B affects to rotate the direction of spins traveling from the first ferromagnetic layer 1 towards the second ferromagnetic layer 2, and voltage between the second ferromagnetic layer 2 and the second electrode 5, i.e. output voltage is varied depending on the magnetic field B. This voltage is detected by a voltage measuring circuit.

FIG. 19 is a plan view of a spin transport device according to the sixth embodiment, and FIGS. 20 and 21 are views of sections XX-XX and XXI-XXI, respectively, of the spin transport device.

The spin transport device according to the sixth embodiment differs from that of the fifth embodiment in that the third wire 8c and the coating layer 10 have increased width in the Y-axis direction and are surrounded by a magnetic yoke 9, and an insulating layer 7x is provided between the magnetic yoke 9 and the wire 8c. The spin transport device according to the sixth embodiment is otherwise the same as that of the fifth embodiment. The insulating layer 7x is made of an organic insulating material such as $SiO_2$ or SiNx.

The magnetic yoke 9 has a rectangular shape as viewed from the direction of the Z-axis (FIG. 19), also a rectangular shape as viewed from the Y-axis (FIG. 20), and has a shape where a part of a side of a square is absent as viewed from the X-axis (FIG. 21), in which part the semiconductor layer 3C is arranged. The magnetic yoke 9 surrounds the X-axis and both ends in the circumferential direction respectively attach to two side surfaces (XZ plane) of the semiconductor layer 3C. In other words, the semiconductor layer 3C is again arranged within a magnetic circuit of the magnetic yoke 9.

Again in this structure, the wire 3c is connected to an electric current source at both ends, and lines of magnetic force surrounding the X-axis along which the wire 8c is provided are effectively introduced in the semiconductor layer 3C, thereby effectively generating a magnetic field in the semiconductor layer 3C. Accordingly, spins injected from the first ferromagnetic layer 1 are affected by the magnetic field B upon their diffusion into the second ferromagnetic layer 2.

In the above embodiments where a SOI substrate is used, a gate voltage can be applied to the semiconductor layer 3C, to which spins are transported, from the semiconductor substrate 3A through the intermediate insulating layer 3B. When gate voltage is applied to the semiconductor substrate 3A, a gate electric potential of the semiconductor layer 3C is modified through the intermediate insulating layer 3B. Accordingly, transport properties of the spins in the semiconductor layer 3C are modified, so that the output and sensitivity to the external magnetic field can be modified. Namely, by controlling the gate voltage, the amount of spins or electrons reaching to the second ferromagnetic layer 2 can be controlled. As gate voltage is applied, it is preferable that the semiconductor substrate 3A is connected to gate voltage applying circuit (voltage applying means) VAC, and that a dopant is added in the region between the first ferromagnetic layer 1 and the second ferromagnetic layer 2 in order to reduce resistance.

The following descriptions are supplied regarding to the magnetization directions in the above first to sixth embodiments.

FIGS. 23A and 23B are vertical sectional views of the ferromagnetic layers. FIGS. 23A and 23B respectively show detailed structures of the first and second ferromagnetic layers 1 and 2. In the first to fourth embodiments, the magnetization direction D1 of the first ferromagnetic layer 1 is the same as the magnetization direction D2 of the second ferromagnetic layer 2, which are parallel to the Y-axis and fixed. The magnetization direction can be fixed by the method wherein an antiferromagnetic layer is exchange-coupled to a ferromagnetic layer or wherein an aspect ratio of a ferromagnetic layer in the XY plane is increased to secure shape anisotropy. These methods may be used alone or in combination. These procedures allow effective fixation of the magnetization directions of the first and second ferromagnetic layers. In the fifth and sixth embodiments, the magnetization direction is fixed to the X-axis direction by means of an antiferromagnetic layer.

When an antiferromagnetic layer is used to fix the magnetization direction of the first ferromagnetic layer 1, the tunnel barrier layer 71, the ferromagnetic layer 1, the antiferromagnetic layer 1H, and a protective film 1P are stacked one over another in this order, as shown in FIG. 23A, in which the ferromagnetic layer 1 and the antiferromagnetic layer 1H are exchange-coupled. The protective film 1P is provided with a contact hole in which a wire layer 1w is provided such that it is brought into contact with the antiferromagnetic layer 1H.

When an antiferromagnetie layer is used to fix the magnetization direction of the second ferromagnetic layer 2, the tunnel barrier layer 72, the ferromagnetic layer 2, the antiferromagnetic layer 2H and a protective film 2P are stacked one over another in this order, as shown in FIG. 23B, in which the ferromagnetic layer 2 and the antiferromagnetic layer 211 are exchange-coupled. The protective film 2P is provided with a contact hole in which a wire layer 2w is provided such that it is brought into contact with the antiferromagnetic layer 2H.

When shape anisotropy is utilized, the magnetization directions in conformity with the Y-axis direction can be obtained by selecting the dimensions in the X-axis direction of the first ferromagnetic layer 1 and the second ferromagnetic layer 2 longer than that in the Y-axis direction. The aspect ratio (Y/X) in this case is preferably 3 or more, and more preferably 5 or more.

The ferromagnetic layer is a metal containing at least one of Cr, Mn, Co, Fe and Ni or an alloy containing the metal. The ferromagnetic layer can contain at least one element from B, C and N and can be a compound combined with the element. In the above examples, the ferromagnetic layer is CoFe.

The antiferromagnetie layer can be made of such materials as Mn alloys, e.g. FeMn, IrMn, PtMn or NiMn.

The spin transport device comprises, in addition to the first and second ferromagnetic layers, the first and second electrodes, i.e. comprises four terminals. In this case, a spin accumulation is generated immediately below the second ferromagnetic layer 2, and the spin transport device acts by utilizing a spin current alone. The following three patterns (A1 to A3) of magnetization directions are contemplated for the spin transport device utilizing a spin current alone.

(A1) When the magnetization directions D1 and D2 are both fixed and are the same (parallel), the following description may be provided. When the magnetization direction D1 of the first ferromagnetic layer 1 and the magnetization direction D2 of the second ferromagnetic layer 2 are both fixed, the control factor of a spin polarizability of a spin current having a specific polarization direction immediately below the second ferromagnetic layer 2 is an external magnetic field B generated by a wire. When the external magnetic field B makes many spins to rotate, output voltage of the spin polarization is decreased as a function of the spin rotating phase and their attenuation due to the magnetic field, while without rotation of spins, output of the spin polarization is attenuated as a function of the traveling distance. Namely, the magnetic field B can be varied depending on an electric current flowing through a wire in order to temporarily maintain output voltage at a constant value. Different output voltages can be obtained from different combinations between a condition of electron supply from an electron flow source and a condition of magnetic field generation by application of an electric current from an electric current source to the wire for generation of the magnetic field. Calculations can also be carried out by combining these conditions. Thus, the spin transport device can possess calculation function. The spin transport device can be used for volatile memory devices in rewritable logic devices or temporarily rewritable arithmetic devices utilizing spin transport.

(A2) When the magnetization directions D1 and D2 are both fixed and are opposite to each other (anti-parallel), the following description may be provided. It is contemplated that the magnetization direction of the first ferromagnetic layer 1 is opposite to the magnetization direction of the second ferromagnetic layer 2. In this case, only the logic structure of output voltage according to the magnetic field B is different from the above (A1). Thus, the spin transport device can be used for volatile memory devices in rewritable logic devices or temporarily rewritable arithmetic devices utilizing spin transport.

(A3) When one of the magnetization directions D1 and D2 is fixed and the other is not fixed, the following description may be provided. Namely, it is also contemplated that the magnetization direction D2 of the second ferromagnetic layer 2 is fixed without fixing the magnetization direction D1 of the first ferromagnetic layer 1. In this case, the coercive force of the second ferromagnetic layer 2 is higher than that of the first ferromagnetic layer 1. The coercive force can be increased by using an antiferromagnetic layer or increasing an aspect ratio, as described above. In this case, the magnetization direction of the second ferromagnetic layer 2 is less flexible than that of the first ferromagnetic layer 1. Of course, the first ferromagnetic layer 1 has more or less anisotropic nature and is single-domain. Thus, even when a magnetic field is not applied, the magnetization direction tends to be moderately oriented to a constant direction. In other words, the modification in the magnetization direction of the first ferromagnetic layer 1 by means of an external magnetic field or spin injection modifies output voltage, and therefore the magnetization direction of the first ferromagnetic layer 1 is stored as one piece of information. A magnetic field generated by a wire is also the control factor of output voltage. During the process of transmission of a spin current, application of a magnetic field varies the polarizability of specifically polarized spins in the region immediately below the second ferromagnetic layer 2. Thus, the spin transport device can possess calculation function by controlling, in addition to the magnetization direction, the presence or absence of magnetic fields. Accordingly, the spin transport device can be used for nonvolatile memory devices according to the magnetization directions of the first ferromagnetic layer 1 and the second ferromagnetic layer 2, volatile memory devices in rewritable logic devices or temporarily rewritable arithmetic devices utilizing spin transport. When the magnetization direction of the first ferromagnetic layer 1 is modified by means of a magnetic field to be measured, the spin transport device can also be used as a measuring sensor of the magnetic field to be measured. In this case, the external magnetic field B generated by the wire can be used for on/off of the output voltage.

In the above configurations, the spin transport device may utilize magnetoresistance effects. In this case, among the above four terminals, the first and second ferromagnetic layers are used, while the first and second electrodes are not used. Namely, an electron flow source is connected between the first ferromagnetic layer 1 and the second ferromagnetic layer 2, thereby applying electrons containing specifically polarized spins therebetween, as well as a voltage detector is connected therebetween to measure voltage between these terminals varied by magnetoresistance effects. The following three patterns (B1 to B3) of magnetization directions are contemplated for the spin transport device utilizing magnetoresistance effects.

(B1) When the magnetization directions D1 and D2 are both fixed and are the same (parallel), the following description may be provided. When a magnetic field B is not applied, traveling spins do not rotate in principle. Thus, when electrons containing specifically polarized spins reach to the second ferromagnetic layer 2, magnetic resistance between the first ferromagnetic layer 1 and the second ferromagnetic layer 2 is decreased. When a constant amount of an electron flow is applied, output voltage is decreased. When a magnetic field B is applied, spins rotate, thereby increasing the magnetic resistance; thus application of a constant amount of an electron flow increases output voltage. Namely, a magnetic field can be varied according to an electric current in a wire in order to temporarily maintain constant output voltage. Different output voltages can be obtained from different combinations between a condition of electron supply from an electron flow source and a condition of magnetic field generation by application of an electric current from an electric current source to the wire for generation of the magnetic field. Calculations can also be carried out by combining these conditions. Thus, the spin transport device can possess calculation function. The spin transport device can be used for volatile memory devices in rewritable logic devices or temporarily rewritable arithmetic devices utilizing spin transport, and is advantageous in that a change can be effectively obtained with application of a weak magnetic field.

(B2) When the magnetization directions D1 and D2 are both fixed and are opposite to each other (anti-parallel), the following description may be provided. In this case, the logic structure of output voltage is different compared to the case where the magnetization directions are the same (parallel). When a magnetic field B is not applied, traveling spins do not rotate in principle. However, as the magnetization directions D1 and D2 are opposite, magnetic resistance between the first ferromagnetic layer 1 and the second ferromagnetic layer 2 remains high when electrons containing specifically polarized spins reach to the second ferromagnetic layer 2. Thus, when a constant amount of an electron flow is applied, output voltage is increased. When a magnetic field B perpendicular to the magnetization direction is applied, spins rotate with high uniformity, thereby decreasing magnetic resistance; thus a constant amount of an electron flow decreases output voltage. Namely, a magnetic field B can be varied according to an electric current in a wire in order to temporarily maintain constant output voltage. Different output voltages can be obtained by varying the combinations between a condition of electron supply from an electron flow source and a condition of magnetic field generation by application of an electric current from an electric current source to the wire for generation of the magnetic field. Calculations can also be carried out by combining these conditions. Thus, the spin transport device can possess calculation function. The spin transport device can be used for volatile memory devices in rewritable logic devices or temporarily rewritable arithmetic devices utilizing spin transport, and is advantageous in that a change can be effectively obtained with application of a weak magnetic field.

(B3) When one of the magnetization directions D1 and D2 is fixed and the other is not fixed, the following description may be provided. Namely, it is also contemplated that the magnetization direction D2 of the second ferromagnetic layer 2 is fixed without fixing the magnetization direction D1 of the first ferromagnetic layer 1. In this case, the coercive force of the second ferromagnetic layer 2 is higher than that of the first ferromagnetic layer 1. The coercive force can be increased by using an antiferromagnetic layer or increasing an aspect ratio, as described above. In this case, the magnetization direction of the second ferromagnetic layer 2 is less flexible than, that of the first ferromagnetic layer 1. Of course, the first ferromagnetic layer 1 has more or less anisotropic nature and is single-domain. Thus, even when a magnetic field is not applied, the magnetization direction tends to be moderately oriented to a constant direction. In other words, the modification in the magnetization direction of the first ferromagnetic layer 1 by means of an external magnetic field or spin injection modifies output voltage, and therefore the magnetization direction of the first ferromagnetic layer 1 is stored as one piece of information. A magnetic field B generated by a wire is also the control factor of output voltage. During the process of transmission of an electron current, application of a magnetic field varies the ratio of specifically polarized spins reaching to the area immediately below the second ferromagnetic layer 2. Thus, the spin transport device can possess calculation function by controlling, in addition to the magnetization direction, the presence or absence of magnetic fields. Accordingly, the spin transport device can be used for nonvolatile memory devices according to the magnetization directions of the first ferromagnetic layer 1 and the second ferromagnetic layer 2, volatile memory devices in rewritable logic devices or temporarily rewritable arithmetic devices utilizing spin transport. When the magnetization direction of the first ferromagnetic layer 1 is modified by means of a magnetic field to be measured, the spin transport device can also be used as a measuring sensor of the magnetic field to be measured. In this case, the external magnetic field B generated by the wire can be used for on/off of the output voltage.

Production methods of the above spin transport devices are now described.

(In Case of First Embodiment)

The SOI substrate is prepared in which the semiconductor substrate made of Si, the intermediate insulating layer made of $Al_2O_3$ and the semiconductor layer made of Si are deposited one over another in this order. The surface of the semiconductor layer is cleaned to remove impurities and oxides thereon. A dopant is added from the surface of the semiconductor layer to increase the dopant concentration and modify an electron state in the surface layer of the semiconductor layer. The addition of a dopant can be carried out by ion injection and P or Sb may be employed as a dopant.

On the surface of the semiconductor layer is formed by MBE (molecular beam epitaxy) an insulating film (MgO, $Al_2O_3$ or $MgAl_2O_4$) as the tunnel barrier layer having a thickness of about 1 nm, followed by formation of the ferromagnetic layer on the tunnel barrier layer by sputtering. Fe may be used as the ferromagnetic layer, for example, and a Ru layer and a Ta layer as a hard mask in combination are deposited thereon in this order. An antiferromagnetic layer may be deposited on the ferromagnetic layer before formation of the hard mask. Heat and magnetic field may be optionally applied to the ferromagnetic layer in order to fix the magnetization direction. A photoresist is then applied on the hard mask and the hard mask in the periphery of a rectangular channel region is removed by ion milling or dry etching to leave the channel region by photolithography.

By using this hard mask, the semiconductor layer made of Si is then etched so as to reach to the intermediate insulating layer. Etching can be carried out by wet etching or dry etching such as reactive cry etching (RIE).

The hard mask is then removed by ion milling to expose the ferromagnetic layer. A negative electron beam resist is applied on the exposed ferromagnetic layer, and the resist surface is scanned with two electron beams parallel to the Y-axis to form a pair of long and thin exposure patterns and is subjected to a processing procedure to leave long and thin resist patterns. By using the resist patterns as masks, the ferromagnetic layer is subjected to ion milling until the surface of the semiconductor layer is exposed to define the first ferromagnetic layer and the second ferromagnetic layer having the same shapes as the resist patterns.

Next, an insulating film is formed on the exposed semiconductor layer. The insulating film is made of a silicon dioxide film and covers both side surfaces and the upper surface of the semiconductor layer made of $SiO_2$. The insulating film can be formed by sputtering or thermal oxidation of Si. On the insulating film, a resist pattern having two openings is formed by photolithography, and the insulating film exposed in the openings is removed by wet etching using an aqueous solution of hydrogen fluoride or dry etching to expose the surface of the semiconductor layer. On the surface of the semiconductor layer exposed in the pair of the openings are deposited the first electrode and the second electrode as described above. The first electrode and the second electrode may be respectively formed with small Al layers having low interface resistance.

Thereafter, the first wire is formed on the side surface of the semiconductor layer via the insulating film. A resist pattern having an opening at an area where the wire is to be formed is formed by photolithography and the first wire is embedded in the opening, thereby obtaining the first wire. Cu and the like metals can be used for the first wire and the wire can be embedded by plating or sputtering.

The SOI substrate can provide an effect such that an influence due to large thickness of the semiconductor layer may be suppressed. However, when such effect is not necessary, the substrate provided may be a Si substrate instead of the SOI substrate. A magnetic shield surrounding the entire device or substrate may be optionally formed.

(In Case of Second Embodiment)

The spin transport device of the second embodiment further comprises the magnetic yoke in the spin transport device of the first embodiment. Thus, the production method of the spin transport device of the second embodiment is the same as that of the first embodiment up to the step of formation of the first wire, and is different in that the magnetic yoke is formed after this step.

Before forming the magnetic yoke, the insulating layer 7x shown in FIG. 9 is formed in order to insulate between the magnetic yoke and the wire. In order to form the insulating layer, a resist pattern having an opening at an area where the insulating layer is to be formed is formed by photolithography and the insulating layer is deposited in the opening by sputtering. Although the insulating layer 7x is formed at an area where it is desired in FIG. 9, the insulating layer may be alternatively formed on the entire surface before the magnetic yoke is formed.

After the insulating layer is formed, a resist pattern having an opening at an area where the magnetic yoke is to be formed is formed by photolithography and the magnetic yoke is deposited in the opening. The deposition can be carried out by sputtering. Alternatively, a method may be employed in which a resist pattern having an opening at an area where the magnetic yoke is to be formed is formed by photolithography, the peripheral surface thereof is covered with an insulating layer such as $SiO_2$, the resist pattern is then removed, an magnetic yoke material is deposited by sputtering in an opening appeared after this removal, and chemical mechanical polishing is provided from the side of the exposed surface for planarization. In this case, the insulating layer surrounds the magnetic yoke. In the case of the second embodiment, one end in the direction of Y-axis of the area where the magnetic yoke is to be formed is located on the semiconductor layer, and the other end is located at the outside of the semiconductor layer. It is also possible, as similar to the first embodiment, to use a Si substrate instead of the SOI substrate and to optionally form a magnetic shield surrounding the entire device or substrate.

(In Case of Third Embodiment)

The spin transport device of the third embodiment has two wires instead of one in the spin transport device of the first embodiment. Thus, the production method of the spin transport device of the third embodiment is the same as that of the first embodiment except that the second wire 8b is also formed in the step of formation of the first wire 8a in the same manner. It is also possible, as similar to the first embodiment, to use a Si substrate instead of the SOI substrate and to optionally form a magnetic shield surrounding the entire device or substrate.

(In Case of Fourth Embodiment)

The spin transport device of the fourth embodiment further comprises the magnetic yoke in the spin transport device of the third embodiment. The production method of the spin transport device of the fourth embodiment is, therefore, the same as that of the third embodiment up to the step of formation of the first wire and the second wire and is different in that the magnetic yoke is formed after this step. The step of formation of the magnetic yoke is the same as that of the second embodiment except that the shape of the yoke is different, and before the formation of the magnetic yoke, the insulating layers 7x and 7y are formed in the same manner as in the second embodiment for insulation. In the case of the second embodiment, one end in the direction of Y-axis of the area where the magnetic yoke is to be formed is located on the semiconductor layer, and the other end is located at the outside of the semiconductor layer, while in the third embodiment, both ends are located at the outside of the semiconductor layer. It is also possible, as similar to the first embodiment, to use a Si substrate instead of the SOI substrate and to optionally form a magnetic shield surrounding the entire device or substrate.

(In Case of Fifth Embodiment)

The spin transport device of the fifth embodiment is different from the spin transport device of the first embodiment in that the position of the wire is changed to the one above the semiconductor layer. Thus, the production method of the spin transport device of the fifth embodiment is the same as that of the first embodiment except that the third wire 8c is formed at the position where it is to be formed in the step of formation of the first wire 8a. The coating layer 10 is of course formed on the insulating film above the semiconductor layer by sputtering, and then the third wire 8c is formed thereon (see FIG. 17). The coating layer 10 is simultaneously etched using the same resist upon etching for formation of the third wire 8c. It is also possible, as similar to the first embodiment, to use a Si substrate instead of the SOI substrate and to optionally form a magnetic shield surrounding the entire device or substrate.

(In Case of Sixth Embodiment)

The spin transport device of the sixth embodiment is different from the spin transport device of the fifth embodiment in that the dimension of the wire is altered and the magnetic yoke is provided. The production method of the spin transport device of the sixth embodiment is therefore the same as that of the fifth embodiment up to the step of formation of the third wire and is different in that the dimension in the Y-axis is extended and that the magnetic yoke is formed after this step. The step of formation of the magnetic yoke is the same as that of the second embodiment except that the shape of the magnetic yoke is different, and before the formation of the magnetic yoke, the insulating layer 7x is formed in the same manner as the second embodiment for insulation. In the case of the second embodiment, one end in the direction of Y-axis of the area where the magnetic yoke is to be formed is located on the semiconductor layer, and the other end is located at the outside of the semiconductor layer, while in the sixth embodiment, both ends are located at the outside of the semiconductor layer. A magnetic yoke may be formed having an inverted U-shape in the YZ section on the lower region (the region on the side closer to the semiconductor layer) of the magnetic yoke flanking the side of the semiconductor layer after its formation by patterning. It is also possible, as similar to the first embodiment, to use a Si substrate instead of the SOI substrate and to form a magnetic shield surrounding the entire device or substrate. In case of the spin transport device utilizing magnetoresistance effects, it is not necessary to form the first electrode and the second electrode.

As described above, the spin transport device of the present embodiments can be used for nonvolatile memory devices according to the magnetization directions of the first ferromagnetic layer and the second ferromagnetic layer, volatile memory devices in rewritable logic devices or temporarily rewritable arithmetic devices utilizing spin transport. It is also possible to, by positively utilizing the nature of modification of magnetization information, apply an external magnetic field to the spin transport pathway to modulate or erase the magnetization information, of the spins during their transport. Provided that the spin lifetime and a distance between electrodes are sufficient, data is rewritable by utilizing the spin rotational vibration. In order to avoid the generation of undesired magnetic field in the semiconductor layer 3C, a magnetic shield may be formed around a channel as a spin transport pathway.

Any magnetization directions of the ferromagnetic layer may be used in either case of a non-localized arrangement utilizing a spin current alone or case of utilizing magnetoresistance effects. In the former case of non-localized arrangement, output results are the same between when the magnetization directions are parallel and anti-parallel. However, the magnetization directions of the first and second ferromagnetic layers are preferably parallel because it is easy to obtain parallel magnetization directions by heating the ferromagnetic layers with applying magnetic fields in the same direction during the production procedure. On the other hand, in the latter case of the arrangement utilizing magnetoresistance effects, the magnetization directions of the first and second ferromagnetic layers are preferably anti-parallel because a bigger output can be obtained than they are parallel.

What is claimed is:

1. A spin transport device comprising:
   a semiconductor layer;
   a first ferromagnetic layer provided on the semiconductor layer via a first tunnel barrier layer;
   a second ferromagnetic layer provided on the semiconductor layer via a second tunnel barrier layer so as to be divided from the first ferromagnetic layer; and
   a first wire which generates, upon application of an electric current, a magnetic field in a region between the first ferromagnetic layer and the second ferromagnetic layer in the semiconductor layer, wherein
   directions of spins in the region between the first ferromagnetic layer and the second ferromagnetic layer are modified by the magnetic field.

2. The spin transport device according to claim 1, wherein:
a magnetization direction of the first ferromagnetic layer is anti-parallel to that of the second ferromagnetic layer, and
a direction of the magnetic field is perpendicular to the magnetization direction of the first or second ferromagnetic layer.

3. The spin transport device according to claim 1, further comprising:
a first electrode provided at a position outside of the region between the first ferromagnetic layer and the second ferromagnetic layer on the semiconductor layer and on the side closer to the first ferromagnetic layer;
a second electrode provided at a position outside of the region between the first ferromagnetic layer and the second ferromagnetic layer on the semiconductor layer and on the side closer to the second ferromagnetic layer;
an electron flow source for applying electrons between the first ferromagnetic layer and the first electrode; and
voltage measuring means for measuring voltage between the second ferromagnetic layer and the second electrode.

4. The spin transport device according to claim 3, wherein:
a magnetization direction of the first ferromagnetic layer is parallel to that of the second ferromagnetic layer, and
a direction of the magnetic field is perpendicular to the magnetization direction of the first or second ferromagnetic layer.

5. The spin transport device according to claim 1, further comprising a first magnetic yoke surrounding the first wire.

6. The spin transport device according to claim 1, further comprising a second wire which is provided at a position flanking the semiconductor layer together with the first wire and generates, upon application of an electric current, a magnetic field in the region between the first ferromagnetic layer and the second ferromagnetic layer in the semiconductor layer.

7. The spin transport device according to claim 6, further comprising a second magnetic yoke surrounding the second wire.

8. The spin transport device according to claim 1, wherein the first and second tunnel barrier layers are each formed of an insulating film or a Schottky barrier.

9. The spin transport device according to claim 8, wherein the insulating film is made of MgO, $Al_2O_3$ or $MgAl_2O_4$.

10. The spin transport device according to claim 1, wherein the second ferromagnetic layer has a higher coercive force than the first ferromagnetic layer.

11. The spin transport device according to claim 1, wherein a magnetization direction of the second ferromagnetic layer is fixed by further comprising an antiferromagnetic layer exchange-coupled to the second ferromagnetic layer, and/or by conferring shape anisotropy to the second ferromagnetic layer.

12. The spin transport device according to claim 1, further comprising:
a semiconductor substrate on which the semiconductor layer is formed via an intermediate insulating layer; and
voltage applying means for applying gate voltage to the semiconductor substrate.

* * * * *